United States Patent
Kim et al.

(10) Patent No.: US 10,515,737 B2
(45) Date of Patent: Dec. 24, 2019

(54) CONDUCTIVE PASTE COMPOSITION, METHOD FOR PREPARING THE COMPOSITION AND ELECTRODE FORMED BY THE COMPOSITION

(71) Applicant: Korea Electronics Technology Institute, Seongnam-si, Gyeonggi-do (KR)

(72) Inventors: Sung Hyun Kim, Yongin-si (KR); Ji Sun Park, Seongnam-si (KR); Myong Jae Yoo, Seoul (KR)

(73) Assignee: Korea Electronics Technology Institute, Gyeonggi-Do (KR)

( * ) Notice: Subject to any disclaimer, the term of this patent is extended or adjusted under 35 U.S.C. 154(b) by 0 days.

(21) Appl. No.: 15/799,810

(22) Filed: Oct. 31, 2017

(65) Prior Publication Data

US 2019/0115117 A1    Apr. 18, 2019

(30) Foreign Application Priority Data

Oct. 12, 2017  (KR) .................. 10-2017-0132229
Oct. 12, 2017  (KR) .................. 10-2017-0132239

(51) Int. Cl.

| | |
|---|---|
| *H01B 1/22* | (2006.01) |
| *H05K 1/09* | (2006.01) |
| *C09D 5/24* | (2006.01) |
| *C08K 3/38* | (2006.01) |
| *C08K 3/08* | (2006.01) |
| *H01L 31/0224* | (2006.01) |

(52) U.S. Cl.
CPC .............. *H01B 1/22* (2013.01); *C08K 3/38* (2013.01); *C09D 5/24* (2013.01); *H05K 1/092* (2013.01); *C08K 2003/085* (2013.01); *H01L 31/022425* (2013.01)

(58) Field of Classification Search
CPC . H01B 1/20; H01B 1/22; H05K 1/092; H05K 1/095; H05K 1/097; C09D 5/24; C08K 3/38; B22F 1/0059; B22F 1/025
See application file for complete search history.

(56) References Cited

U.S. PATENT DOCUMENTS

| | | | |
|---|---|---|---|
| 4,322,316 A * | 3/1982 | Provance | H01L 27/013 106/1.12 |
| 8,728,355 B2 * | 5/2014 | Kuroki | H01B 1/16 252/512 |
| 2011/0315217 A1 | 12/2011 | Gee | |
| 2013/0248777 A1 * | 9/2013 | Sgriccia | C03C 8/18 252/514 |
| 2014/0302333 A1 * | 10/2014 | Albaugh | C09D 11/037 428/457 |
| 2015/0197645 A1 * | 7/2015 | Inaba | H01B 1/16 252/512 |

FOREIGN PATENT DOCUMENTS

JP    2005-243500    9/2005

OTHER PUBLICATIONS

NIOSH Pocket Guide to Chemical Hazards, DHHS NIOSH Publication No. 2005-149, pp. 31. (Year: 2007).*

* cited by examiner

*Primary Examiner* — Harold Y Pyon
*Assistant Examiner* — Matthew R Diaz
(74) *Attorney, Agent, or Firm* — Knobbe, Martens, Olson & Bear, LLP

(57) ABSTRACT

A conductive paste composition, a method for preparing the same, and an electrode formed by the conductive paste composition are disclosed. In one aspect, the conductive paste composition includes a copper-based particle and a boron-based particle of which a surface is partially or entirely coated with boron oxide. The boron-based particle is crystalline boron-based particle or amorphous boron-based particle. The boron-based particle has a content of more than 1 wt % to less than 10 wt % based on a total content of the conductive paste composition.

6 Claims, 19 Drawing Sheets

Example 7

Example 7

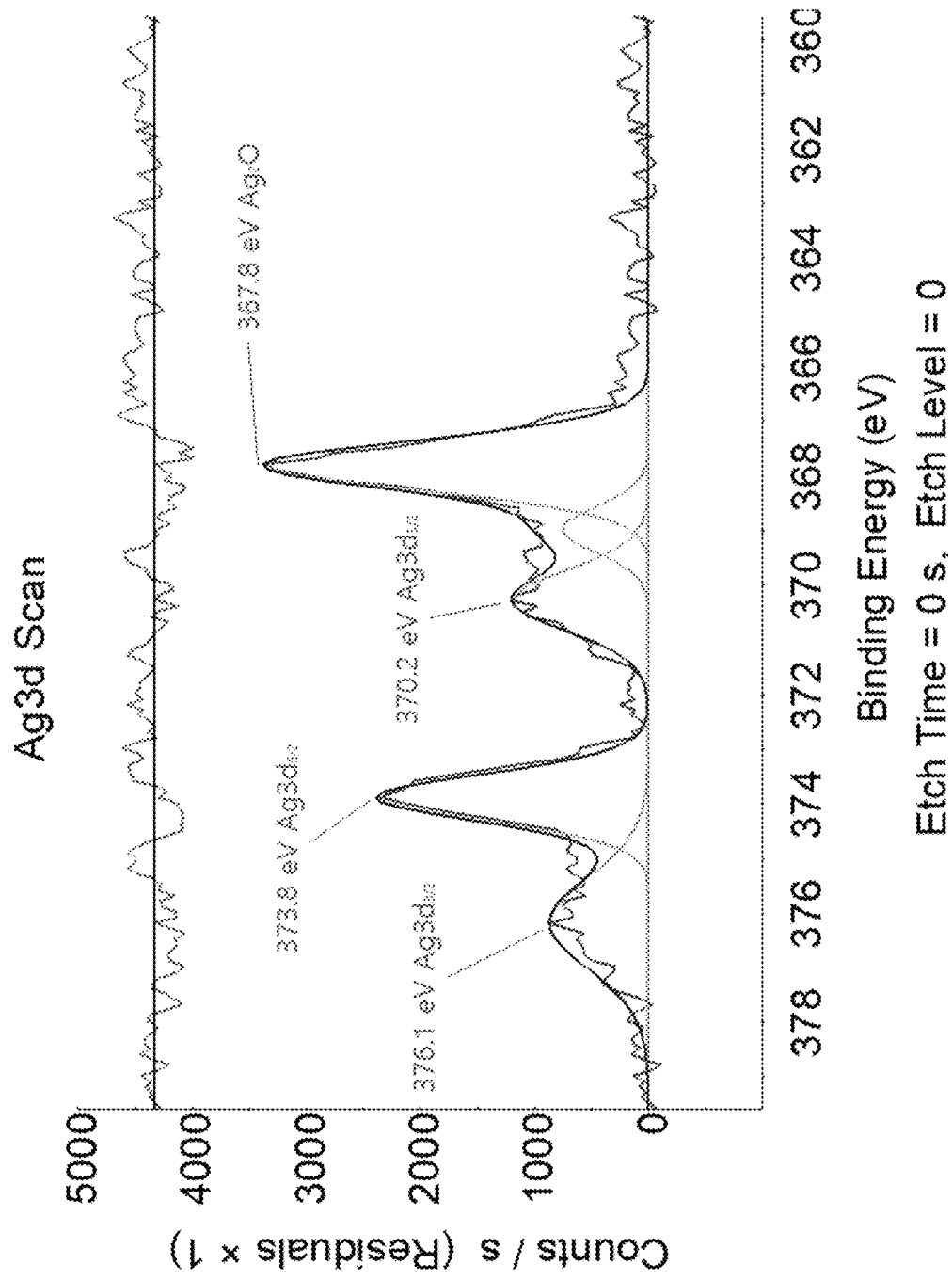

CONDUCTIVE PASTE COMPOSITION, METHOD FOR PREPARING THE COMPOSITION AND ELECTRODE FORMED BY THE COMPOSITION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims benefit of priority to Korean Patent Application No. 10-2017-0132229 filed on Oct. 12, 2017 and No. 10-2017-0132239 filed on Oct. 12, 2017 in the Korean Intellectual Property Office, the disclosure of each of which is incorporated herein by reference in its entirety.

BACKGROUND

Field

The present disclosure relates to a conductive paste composition, and more particularly, to a conductive paste composition using a copper-based particle, a method for preparing the same, and an electrode formed by the conductive paste composition.

Description of the Related Art

A conductive paste composition used as an electrode material is able to be used for electrode materials such as a solar cell, a digitizer, FPCB, LTCC, MLCC, etc. The conductive paste composition for the electrode material forms an electrode generally by a high-temperature thermal firing process in the air. However, when the high-temperature firing is performed, there is a problem in that the conductive metal is easily oxidized, and thus, conductivity is lowered after the electrode is formed.

In order to solve this problem, an attempt to replace silver, which is not easily oxidized, with a conductive metal is increased rapidly, and in particular, a silver paste composition using silver as the conductive metal is mainly used in the field of solar cells, but since silver is an expensive material, the use of silver in all electrodes has no choice but is continuously accompanied by problems such as productivity, etc. Accordingly, research continues to replace some or all of the silver included in the conductive paste composition with another inexpensive conductive metal. However, a problem of an increase of resistivity of the electrode due to the oxidation of the conductive metal at the time of the high-temperature firing has still not been solved.

Meanwhile, a solar cell is based on a p-n junction 10 structure, and includes an anti-reflection film 20 allowing light to be absorbed into the solar cell well, and a front electrode 30 and a rear electrode 40 pulling electron-hole pairs, which are made inside the silicone, to the outside (see FIG. 1). In general, the solar cell is used in a state where a plurality of solar cells are connected by a module, wherein the front electrode is directly relevant to efficiency of the solar cell and plays an important role in a module connecting the plurality of solar cells. When light enters the solar cell, electrons and holes are generated by an interaction between light and materials constituting a semiconductor of the solar cell, and they move to generate a current, which is called a photoelectric effect. The front electrode collects electrons generated therefrom without loss to create an electrical pathway. When such an electrode for a solar cell, particularly a front electrode, is produced, the front electrode is formed on the side where the anti-reflection film is formed. As a method for producing the electrode, it is general to apply a paste composition including a conductive powder such as silver powder, etc., a glass frit, and a resin binder, and if necessary, further including an additive, on the anti-reflection layer, and to perform a firing process as described above.

Further, characteristics of the electrode are important to improve power generation characteristics of the solar cell. For example, if the series resistance of the electrode is lowered, loss of current may be reduced, and thus, power generation efficiency is increased. Accordingly, various methods for producing the electrode have been proposed to achieve the above object.

In this regard, as described above, the silver paste composition including silver as the conductive metal is used in most of the front electrodes for conventional crystalline silicone solar cells, and thus, there has been a continuing attempt to prepare a paste composition by minimizing a silver content in the paste composition in order to reduce the cost increase of the cell according to the cost increase of silver. For example, techniques for forming electrodes using a Ni/Cu/Ag structure by performing plating as the technique for replacing silver have been proposed. However, a process of removing the anti-reflection layer is required to perform plating, and the electrode is able to be produced in a pilot line, but is not able to be mass produced due to environmental problems such as occurrence of wastewater during plating, etc. As another example, Hitachi, Ltd., has produced a paste composition based on CuP, which is a paste composition for forming a front electrode of a solar cell, but does not recognize the problem of the increase in resistivity at the time of forming the electrode. Further, U.S. Patent Application Publication No. 2011-0315217 discloses formation of an electrode of a solar cell by using a core-shell shaped particle based on a copper, but does not recognize a problem of metal oxidation occurring in the high-temperature process which is necessarily accompanied when the solar cell is produced, and there is no disclosure about a method for solving the problem. Napra Corp., Japan, also achieved resistivity of $3\times10^{-5}$ Ω·cm by using a copper alloy and LMPA, but a firing process at 300° C. or less rather than a high-temperature firing process at 800° C. or more is performed, when considering that the resistivity increases as a firing temperature increases, it is not known whether the resistivity required for the front electrode is able to be achieved even in the high temperature firing process. Further, Japanese Patent Laid-Open Publication No. 2005-243500 discloses a technique for producing an electrode having conductivity. Specifically, it provides the conductive paste composition including an organic binder, a solvent, a glass frit, a conductive powder, and at least one metal selected from Ti, Bi, Zn, Y, In and Mo or a metal compound thereof, wherein the metal or the metal compound thereof has an average particle diameter of 0.001 μm or more to less than 0.1 μm, and it is possible to impart high conductivity and excellent adhesion to a semiconductor. However, this case has problems in that when firing the paste composition, contact resistance is increased due to shrinkage of a coating film and micro crack occurs, and these problems may cause problems that in-plane uniformity of the solar cell is lowered and a conversion efficiency of the solar cell is lowered.

SUMMARY

An aspect of the present disclosure is to provide a conductive paste composition for forming an electrode capable of preventing oxidation of copper at the time of firing to improve resistivity of the electrode while using copper as a conductive metal.

That is, the present disclosure provides a conductive paste composition including a copper-based particle as a conductive metal and exhibiting low resistivity even at the time of high temperature firing, and a method for preparing the same, wherein by using the conductive paste composition to form an electrode, it is possible to improve productivity according to cost reduction by replacing expensive silver with a copper-based particle as the conductive metal, and to exhibit low resistivity at the same level or higher while simultaneously minimizing natural oxidation even when the electrode is exposed to the air after being formed, thereby improving weather resistance.

According to an aspect of the present disclosure, a conductive paste composition includes a copper-based particle; and a boron-based particle of which a surface is partially or entirely coated with boron oxide, wherein the boron-based particle is crystalline boron-based particle or amorphous boron-based particle, and wherein the boron-based particle has a content of more than 1 wt % to less than 10 wt % based on a total content of the conductive paste composition.

According to another aspect of the present disclosure, a method for preparing a conductive paste composition includes: i) dry-crushing boron powder to prepare a boron-based particle of which a surface is partially or entirely coated with boron oxide (S10); and ii) mixing the boron-based particle prepared in step (S10) and a copper-based particle to prepare a conductive paste composition (S20), wherein the boron powder in step (S10) is crystalline boron powder or amorphous boron powder, wherein the dry-crushing in step (S10) is performed for more than 30 minutes to 10 hours or less, and the boron-based particle in step (S20) has a content of more than 1 wt % to less than 10 wt % based on a total content of the conductive paste composition.

According to another aspect of the present disclosure, an electrode includes: copper, $B_2O_3$, and $BCO_2$, wherein a $\Delta$ resistivity index (a resistivity variation index=resistivity after 500 hours/initial resistivity) after 500 hours at a temperature of 85° C. and a relative humidity of 85% is 1.0 or less.

BRIEF DESCRIPTION OF THE DRAWINGS

FIGS. 17 to 19 show XPS results (Cu 2p orbital, B 1s orbital, Ag 3d orbital) of the electrode produced according to Example 9 of the present disclosure.

DETAILED DESCRIPTION

Figure 1:
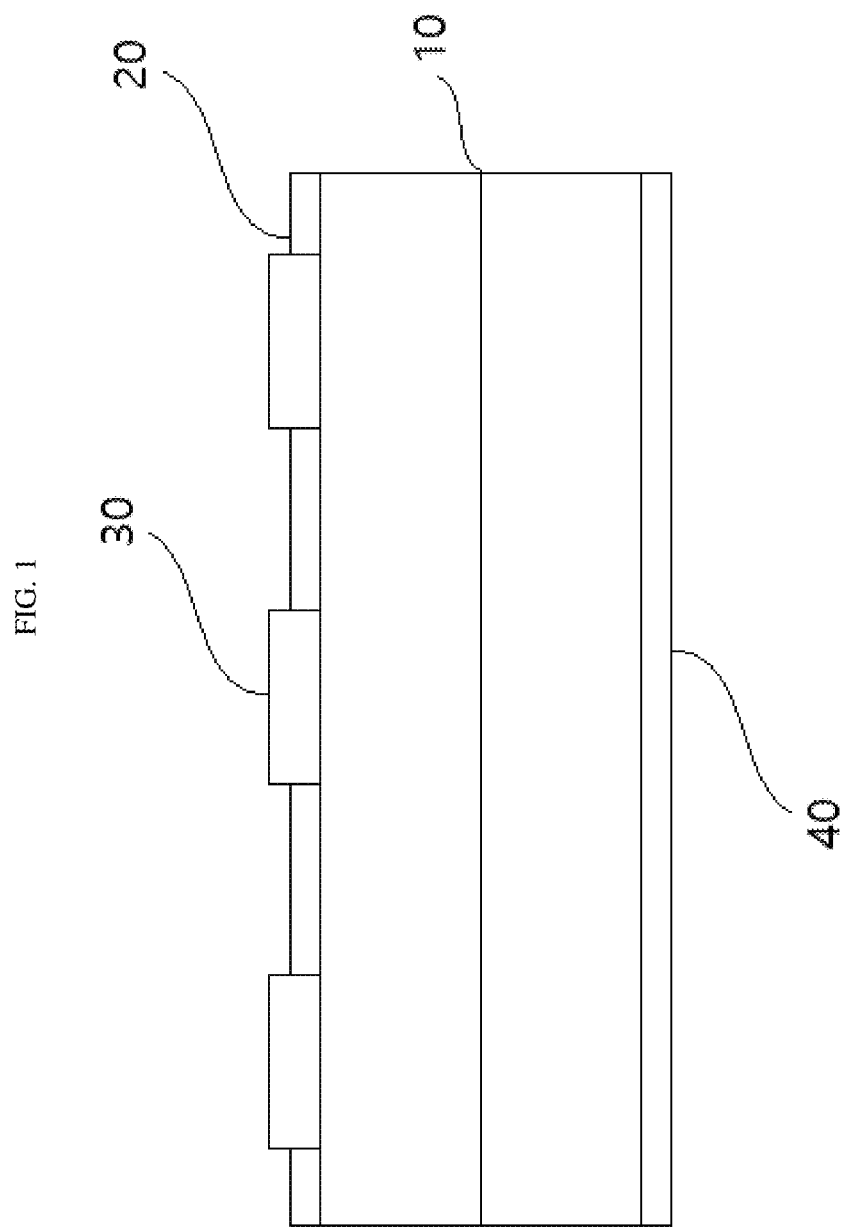
FIG. 1 shows a structure of a solar cell.
Figure 2:
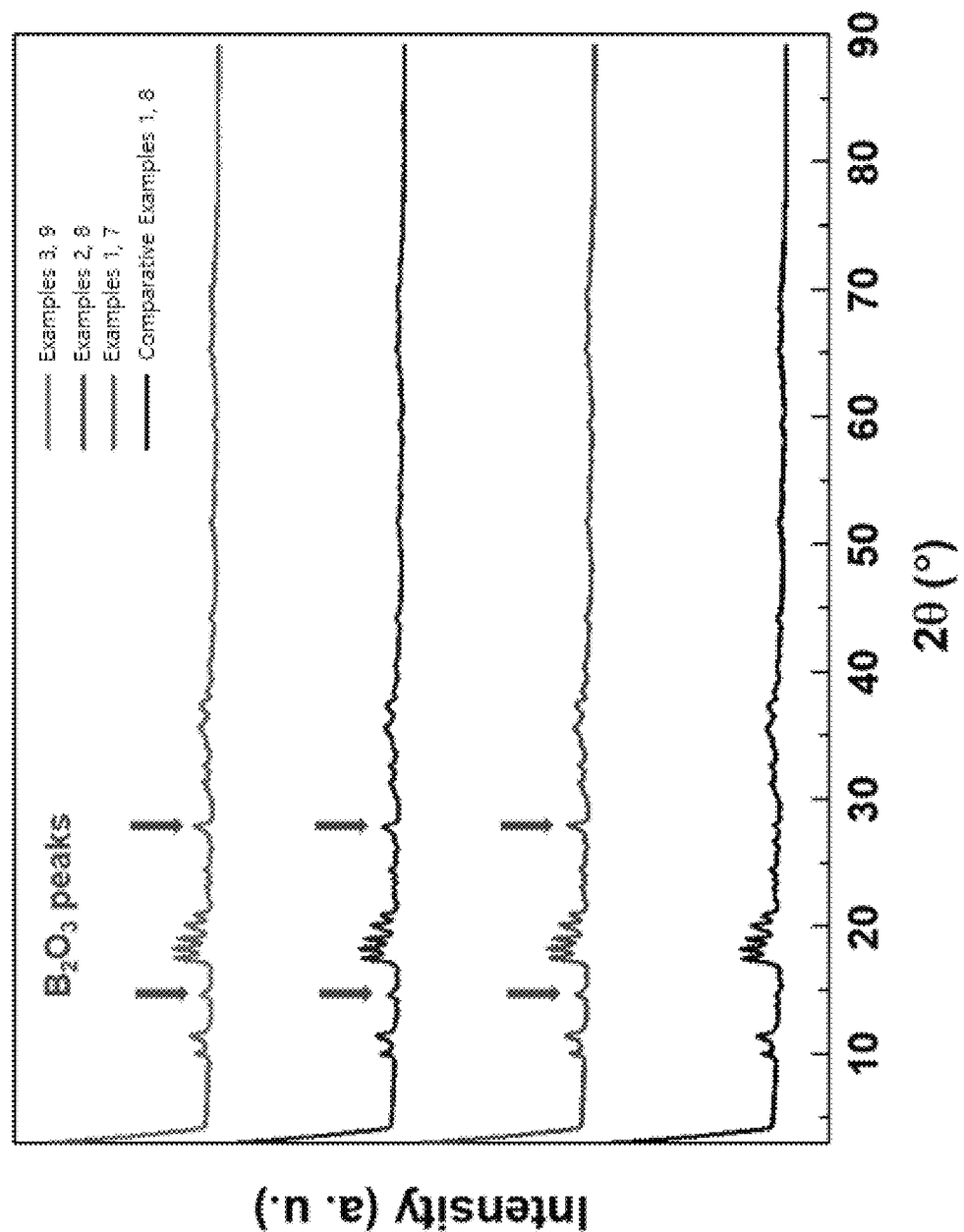
FIG. 2 shows XRD peaks of boron-based particles according to Examples 1 to 3, 7 to 9, and Comparative Examples 1 and 8 of the present disclosure.
Figure 3:
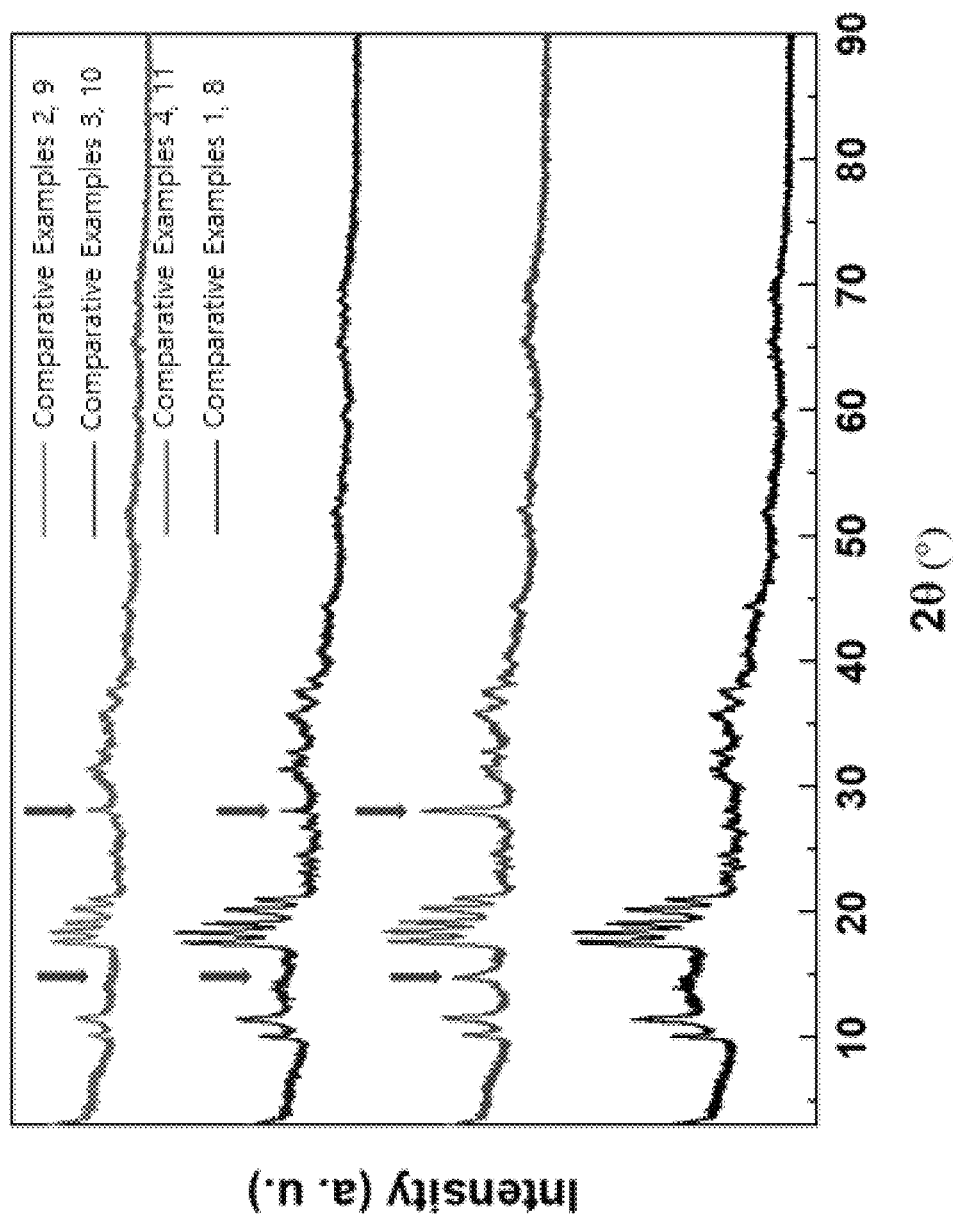
FIG. 3 shows XRD peaks of boron-based particles according to Comparative Examples 1 to 4, 8 to 11 of the present disclosure.

The terms and words used in the present specification and claims should not be interpreted as being limited to typical meanings or dictionary definitions, but should be interpreted as having meanings and concepts relevant to the technical scope of the present disclosure based on the rule according to which an inventor can appropriately define the concept of the term to describe most appropriately the best method he or she knows for carrying out the disclosure.

Hereinafter, the present disclosure will be described in more detail to assist in understanding the technical idea of the present disclosure.

A conductive paste composition according to the present disclosure may include a copper-based particle; and a boron-based particle of which a surface is partially or entirely coated with boron oxide, wherein the boron-based particle is crystalline boron-based particle or amorphous boron-based particle, and wherein the boron-based particle has a content of more than 1 wt % to less than 10 wt % based on a total content of the conductive paste composition.

According to an exemplary embodiment of the present disclosure, the conductive paste composition may be a conductive paste composition for forming an electrode through firing, wherein the electrode may be an electrode of an apparatus selected from the group consisting of a digitizer, a flexible printed circuit board (FPCB), a low temperature co-fired ceramic (LTCC), a multilayer ceramic condenser (MLCC), and a solar cell, etc. When forming the electrode using the conductive paste composition according to the present disclosure, it is possible to prevent oxidation of the copper-based particle, which is a conductive metal, even under a high-temperature firing condition, to thereby reduce resistivity of the formed electrode, and to substitute an expensive silver particle that is conventionally used to thereby improve productivity according to cost reduction. Further, the electrode formed using the conductive paste composition according to the present disclosure is excellent in weather resistance, and thus, a width at which the resistivity varies according to natural oxidation in an atmospheric state is remarkably improved, thereby improving lifetime and durability of the electrode.

That is, the conductive paste composition according to an exemplary embodiment of the present disclosure is characterized by including the copper-based particle rather than the silver particle as a conductive metal. Here, the copper-based particle may be a copper particle, or a copper-based particle of which a surface is partially or entirely coated with silver. The copper particle and the copper particle of which a surface is partially or entirely coated with silver may mean a copper metal particle, a copper metal particle including impurities according to purity, a copper oxide particle, a copper sulfide particle, a copper alloy particle, a copper compound particle, or a powder particle including a material capable of precipitating copper by firing, respectively, and may be at least one selected from the group consisting of the copper particles.

Further, the copper-based particle of which a surface is partially or entirely coated with silver may mean a case where surfaces of all the copper particles are partially or entirely coated with silver. As a specific example, the copper-based particle may be a copper-silver core-shell particle including a copper particle as a core and a shell formed by coating silver on the copper particle, and as a more specific example, at least 50% of the surface of the copper particle may be coated with silver. As described above, in the case where the surface of the copper-based particle is partially or entirely coated with silver, when the copper is oxidized upon firing, oxidation may be prevented due to the coated silver. Further, when forming the electrode using the conductive paste composition, silver capable of sintering at a lower temperature may increase a necking role between copper particles to thereby form a bulk copper-based electrode at the time of forming the electrode, and thus, an efficiency of the electrode may be increased. The silver may be silver (Ag), silver oxide, a silver alloy, a silver compound or a silver particle including a material capable of precipitating silver by firing, and may be at least one selected from the group consisting of the silver particles.

According to an exemplary embodiment of the present disclosure, a content of silver atoms of the copper-based particle of which a surface is partially or entirely coated with silver, that is, a content of silver atoms that coat the copper-based particle may be 1 wt % to 16 wt %, 5 wt % to 16 wt %, or 9 wt % to 16 wt % based on a total content of copper-based particle coated with silver, and when the electrode is formed within this range, an increase in resistivity of the electrode may be prevented.

According to an exemplary embodiment of the present disclosure, the copper-based particle may have an average particle diameter of 1 to 10 μm, 1 to 8 μm, or 2 to 6 μm, and when the electrode is formed by firing within this range, it is possible to realize a fine line width of 35 μm or less while preventing the increase in resistivity. Further, a shape of the copper-based particle according to an exemplary embodiment of the present disclosure may be spherical or non-spherical, and when the shape is spherical, dispersibility in the conductive paste composition is excellent. Here, the average particle diameter may mean an average particle diameter of the copper-based particle measured by a scanning electron microscopy.

Further, according to an exemplary embodiment of the present disclosure, the copper-based particle may have a content of 65 wt % to 96 wt %, 70 wt % to 92 wt %, 73 wt % to 92 wt %, 73 wt % to 91 wt %, 80 wt % to 91 wt %, or 85 wt % to 91 wt % based on the total content of the conductive paste composition. When the electrode is formed within this range, it is possible to realize a fine line width of 35 μm or less while ensuring an electric conductivity applicable as an electrode.

Further, according to an exemplary embodiment of the present disclosure, the conductive paste composition may further include a silver particle together with the copper-based particle. Here, the content of the silver particle to be included may be included within the silver atom content range of the copper-based particle, and when the content of silver coated on the copper-based particle is not sufficient to coat the copper-based particle, the inclusion of the separate silver particle may instead perform the role of the shell formed of silver.

Meanwhile, when the copper-based particle is used as the conductive metal in the conductive paste composition, due to characteristics of the copper-based particle which is easily oxidized as compared to metals such as silver, etc., the copper-based particle used as the conductive metal is oxidized at the time of firing for forming the electrode, in particular, heat-firing under an atmospheric condition, and thus, resistivity is remarkably increased, which may lead to a problem that it is not usable as the electrode. However, when the boron-based particle is included in the conductive paste composition according to the disclosure, the oxidation of the copper-based particle as described above may be prevented. The boron-based particle may be the boron powder particle or the boron oxide powder particle which is a powder particle of boron oxide formed by oxidization of boron. However, in this case, after the electrode is formed, the resistivity may continuously vary according to the natural oxidation of the electrode in the atmospheric state, and thus, the lifetime and durability of the electrode may be deteriorated.

Accordingly, the boron-based particle according to an exemplary embodiment of the present disclosure is characterized in that a part or entire surface of the particle is coated with boron oxide. The boron oxide may be at least one selected from the group consisting of boron monoxide ($B_2O$), boron dioxide ($B_2O_2$), diboron trioxide ($B_2O_3$), tetraboron trioxide ($B_4O_3$), tetraboron pentoxide ($B_4O_5$), and boron suboxide ($B_6O$). The boron-based particle of which the surface is partially or entirely coated with boron oxide may mean a form in which a coating layer formed of boron oxide is present or formed separately on a part or entire surface of the boron particle. As a specific example, the boron-based particle may have a boron oxide coating layer formed by oxidizing the surface of the boron particle, i.e., a part or entire surface of the boron particle into boron oxide due to natural oxidation in the atmosphere at the time of crushing when the boron particle is subjected to dry-crushing through a dry crushing process. As described above, when the boron-based particle of which the surface is partially or entirely coated with boron oxide is included in the conductive paste composition according to the present disclosure as the boron-based particle, it is possible to prevent oxidation of the copper-based particle at the time of forming the electrode and to significantly improve the width at which the resistivity varies according to natural oxidation of the electrode in the atmospheric state after the electrode is formed, and thus, lifespan and durability of the electrode may be improved.

According to an exemplary embodiment of the present disclosure, the boron-based particle may be crystalline boron-based particle or amorphous boron-based particle. Preferably, the boron-based particle may be amorphous boron-based particle.

According to an exemplary embodiment of the present disclosure, the boron-based particle may have a content of more than 1 wt % to less than 10 wt %, 1.5 wt % to 9 wt %, 2 wt % to 7 wt %, 3 wt % to 7 wt %, or 5 wt % to 7 wt % based on the total content of the conductive paste composition. Within this range, an oxidation inhibiting effect may be excellent, and thus, an increase in the resistivity may be prevented and deterioration of dispersibility and printability of the conductive paste composition due to a high specific surface area of the boron-based particle may be prevented. In this regard, according to an exemplary embodiment of the present disclosure, the specific surface area of the boron-based particle may be more than 11.03 $m^2/g$ to 25 $m^2/g$ or less, 12 $m^2/g$ to 19 $m^2/g$, or 13 $m^2/g$ to 15 $m^2/g$. Within this range, the dispersibility and printability of the conductive paste composition may be excellent.

Further, the boron-based particle according to an exemplary embodiment of the present disclosure may exhibit peaks at 14.7° and 26.2° of Bragg's 2θ angle with respect to a Cu Kα characteristic X-ray (wavelength of 1.541 Å), wherein the part or entire surface of the boron particle is oxidized into boron oxide, thereby forming a boron oxide coating layer, and thus, it is possible to prevent oxidation of the copper-based particle at the time of forming the electrode and to significantly improve the width at which the resistivity varies according to natural oxidation of the electrode in the atmospheric state after the electrode is formed, and thus, lifespan and durability of the electrode may be improved. The peak is referred to the document "Supercond. Sci. Technol. 19 (2006) L33-L36" (see Tables 2 and 3).

Further, the boron-based particle according to an exemplary embodiment of the present disclosure may have an average particle diameter of 2 μm or less, 0.1 to 2 μm, or 0.4 to 2 μm, and when the electrode is formed by firing within this range, it is possible to realize a fine line width of 35 μm or less while preventing the change in resistivity. Further, a shape of the boron-based particle according to an exemplary embodiment of the present disclosure may be spherical or non-spherical, and when the shape is spherical, dispersibility in the conductive paste composition is excellent. Here, the average particle diameter may mean an average particle diameter of the boron-based particle measured by a scanning electron microscopy.

Meanwhile, as mentioned above, the surface of the boron-based particle is partially or entirely coated with boron oxide, wherein a content of an oxygen atom included in the total boron-based particle, which includes a content of oxygen included in the coating boron oxide, may be 2 wt % to 15 wt %, 5 wt % to 13 wt %, or 7 wt % to 12 wt % based on a total content of the boron-based particle, and as another example, may be 5 atom % to 20 atom %, or 5 atom % to 15 atom %, or 5 atom % to 10 atom % based on the total content of the boron-based particle. Within this range, it is possible to prevent excessive formation of boron oxide at the time of firing, thereby remarkably reducing the resistivity.

According to an exemplary embodiment of the present disclosure, the conductive paste composition may include a binder to allow for the conductive paste composition including the copper-based particle, that is, the conductive metal powder, to be capable of having viscosity and being subjected to screen printing, and may further include a solvent together with the binder.

As a specific example, the binder may be an organic binder, and may be a resin-based binder as a more specific example. According to an exemplary embodiment of the present disclosure, the binder may be at least one selected from the group consisting of a cellulose-based resin, a polyvinyl alcohol-based resin, an acrylic resin, a butyral resin, an alkyl-based resin modified with a castor oil fatty acid, an epoxy-based resin, a phenol-based resin, a rosin ester-based resin, a polymethacrylate resin, and an ethyleneglycol monobutyl ether monoacetate-based resin, etc., and as a specific example, may be at least one selected from the group consisting of a cellulose-based resin and an acrylic resin. In this case, dispersibility of the conductive paste composition may be excellent, and thus, viscosity may be easily adjusted, and printability may be excellent.

According to an exemplary embodiment of the present disclosure, the binder may have a content of 1 wt % to 20 wt %, 7 wt % to 20 wt %, 9 wt % to 16 wt %, or 9 wt % to 14 wt % based on a total content of the conductive paste composition. Within this range, dispersibility and printability may be excellent.

Meanwhile, the solvent is used for adjusting the viscosity of the conductive paste composition according to the present disclosure, and may be a solvent that does not include a polymer, for example, water or an organic solvent. As a specific example, the organic solvent may be at least one selected from the group consisting of hexane, cyclohexane, a cycloester-based solvent, an amide-based solvent, a ketone-based solvent, a terpene-based solvent, a polyhydric alcohol ester-based solvent, alcohol, and an ester-based solvent of alcohol, etc., and as a more specific example, may be at least one selected from the group consisting of dihydro perpinyl acetate, perpinol and butyl ketyl acetone, and in this case, dispersibility of the conductive paste composition may be excellent, and thus, viscosity may be easily adjusted, and printability may be excellent.

According to an exemplary embodiment of the present disclosure, the solvent may have a content of 1 wt % to 15 wt %, 5 wt % to 15 wt %, 6 wt % to 14 wt %, or 7 wt % to 10 wt % based on a total content of the conductive paste composition. Within this range, dispersibility and printability may be excellent.

Further, according to an exemplary embodiment of the present disclosure, the conductive paste composition may further include at least one additive selected from the group consisting of a thickener, a stabilizer, a dispersant, a thixotropic agent, a defoamer, a plasticizer, a viscosity modifier, a pigment, a UV stabilizer, an antioxidant, and a coupling agent, etc., as needed within a range at which physical properties of the conductive paste composition are not deteriorated.

The conductive paste composition according to the present disclosure may be used to form the electrode of the apparatus selected from the group consisting of a digitizer, a flexible printed circuit board (FPCB), a low temperature co-fired ceramic (LTCC), a multilayer ceramic condenser (MLCC), and a solar cell, etc., as described above, and the conductive paste composition may be applied by screen printing and then fired to form the electrode. As a specific example, when the electrode of the solar cell is formed, the electrode may be formed by printing and drying on a region where formation of the electrode on a back surface of the solar cell is required, i.e., a light-receiving surface side of the solar cell in the case of a front electrode.

Next, there is provided a method for preparing a conductive paste composition for preparing the conductive paste composition according to the present disclosure.

The method for preparing a conductive paste composition according to the present disclosure may include i) dry-crushing boron powder to prepare a boron-based particle (S10); and ii) mixing the boron-based particle prepared in step (S10) and a copper-based particle to prepare a conductive paste composition (S20), wherein the dry-crushing in step (S10) is performed for more than 30 minutes to 10 hours or less, the surface of the boron-based particle prepared in step (S10) is partially or entirely coated with boron oxide, and the boron-based particle in step (S20) has a content of more than 1 wt % to less than 10 wt % based on a total content of the conductive paste composition.

Step (S10) of the present disclosure, which is a step for reducing the average particle diameter of the boron-based particle and for coating the part or entire surface of the particle, may be a step for oxidizing the surface of the particle while simultaneously crushing the boron powder which may include impurities according to purity. That is, the dry-crushing in step (S10) may be a step for oxidizing the surface of the boron-based particle while simultaneously reducing the average particle diameter of the boron particle through the crushing of the boron powder, thereby coating the part or all of the boron-based particles with boron oxide. In this regard, as described above, it is possible to use a boron powder particle or a boron oxide powder particle which is a powder particle of boron oxide formed by oxidizing boron as it is. However, in the case of the boron powder which is generally available, a particle diameter of the boron particle is large, and thus, even if the boron-based particle is uniformly dispersed in the conductive paste composition, the boron-based particle may be concentrated in any part. Thus, the prevention of the oxidation of the conductive metal may not be appropriately achieved. Further, after the electrode is formed using the prepared conductive paste composition, the resistivity of the electrode may continuously vary according to the natural oxidation of the electrode in the atmospheric state, and thus, the lifetime and durability of the electrode may be deteriorated. Thus, when the average particle diameter of the boron-based particle is reduced and the part or entire surface of the particle is coated with boron oxide according to step (S10) of the present disclosure, the dispersibility of the boron-based particle in the conductive paste composition may be improved, and when the electrode is formed, oxidation of the conductive metal may be prevented and the weather resistance of the electrode may be improved.

According to an exemplary embodiment of the present disclosure, the boron powder in step (S10) may be crystalline boron powder or amorphous boron powder. Preferably, the boron powder may be amorphous boron powder.

Meanwhile, the surface of the boron-based particle prepared in step (S10) is partially or entirely coated with boron oxide, which may be formed by oxidizing the part or the entire surface of the boron-based particle caused by friction between the boron-based particle and a crusher or between the boron-based particles during the dry-crushing. According to an exemplary embodiment of the present disclosure, the boron oxide coated on the part or entire surface of the boron-based particle prepared in step (S10) may be at least one boron oxide selected from the group consisting of boron monoxide ($B_2O$), boron dioxide ($B_2O_2$), diboron trioxide ($B_2O_3$), tetraboron trioxide ($B_4O_3$), tetraboron pentoxide ($B_4O_5$), and boron suboxide ($B_6O$). The boron-based particle of which the surface is partially or entirely coated with boron oxide may mean a form in which a coating layer formed of boron oxide is present or formed separately on the part or entire surface of the boron particle.

In this regard, the dry-crushing may be performed in an atmospheric environment, and thus, the oxidation may be caused by oxygen present in the atmosphere. Further, the crushing in step (S10) may be performed by wet-crushing which is performed in a solvent such as ethanol, or the like, in addition to the dry-crushing. However, in this case, even though the average particle diameter of the boron-based particle is reduced, the friction of the boron-based particle is reduced at the time of crushing under a wet condition, and thus, oxidation does not occur smoothly on the surface of the boron-based particle, whereby the surface of the boron-based particle may not be coated with boron oxide, which may result in deterioration of an oxidation-preventing ability of the conductive metal when the electrode is formed, and deterioration in weather resistance of the formed electrode.

According to an exemplary embodiment of the present disclosure, the dry-crushing in step (S10) may be performed for more than 30 minutes to 10 hours or less, more than 30 minutes to 5 hours or less, 1 hour to 3 hours. Within this range, the oxidation on the surface of the boron-based particle progresses smoothly, and the boron oxide is coated.

In addition, according to an exemplary embodiment of the present disclosure, the dry-crushing in step (S10) may be performed at 25° C. to 70° C., 30° C. to 60° C., or 35° C. to 50° C. Within this range, the oxidation on the surface of the boron-based particle progresses smoothly, and the boron oxide is coated.

Further, according to an exemplary embodiment of the present disclosure, the dry-crushing in step (S10) may be performed using a crusher such as a ball mill, a tube mill, a compound mill, a rod mill, a hammer mill, an attrition mill, and a jet mill, etc., and, as a specific example, may be performed at 100 rpm to 650 rpm, 300 rpm to 600 rpm, or 450 rpm to 550 rpm when it is performed by the ball mill.

Step (S20) of the present disclosure is a step for mixing a copper-based particle as a conductive metal together with the boron-based particle prepared in step (S10) to thereby prepare a conductive paste composition, and may be performed by a method for preparing a conductive paste composition that is conventionally performed. The boron-based particle in step (S20) may have a content of more than 1 wt % to less than 10 wt %, 1.5 wt % to 9 wt %, 2 wt % to 7 wt %, 3 wt % to 7 wt % or 5 wt % to 7 wt % based on the total content of the conductive paste composition. The oxidation-preventing effect of the conductive paste composition prepared within this range may be excellent, and thus, the increase of the resistivity may be prevented, and deterioration of the dispersibility and printability of the conductive paste composition due to the high specific surface area of the boron-based particle may be prevented. Further, the copper-based particle in step (S20) may have the same meaning as the copper-based particle included in the conductive paste composition described above.

Further, there is provided an electrode according to the present disclosure.

The electrode according to the present disclosure may be an electrode formed by firing the conductive paste composition according to the present disclosure including the copper-based particle and the boron-based particle. As a specific example, the electrode may be an electrode formed by heat-firing the conductive paste composition at a temperature of 800° C. or higher and an atmospheric environment, or may be an electrode including an active component derived from the conductive paste composition. The active component may mean a component remaining in the electrode without being burned among components constituting the conductive paste composition when the conductive paste composition is heat-fired. As a more specific example, the electrode may include copper, $B_2O_3$ and $BCO_2$ as active components. In this case, the electrode may exhibit low resistivity, and at the same time, even at the time of exposure to the atmosphere after the electrode is formed, natural oxidation may be prevented to the minimum extent, thereby improving weather resistance. As another example, $B_2O_3$ and $BCO_2$ may have a content of 20 wt % or less, 10 wt % or less, 0.01 wt % to 13 wt %, 0.01 wt % to 7 wt %, or 0.1 wt % to 5 wt % based on the total content of the electrode. Within this range, weather resistance may be excellent while simultaneously exhibiting the low resistivity.

In addition, according to an exemplary embodiment of the present disclosure, the electrode may further include silver. A content of copper may be 50 wt % to 99 wt %, 70 wt % to 99 wt %, or 80 wt % to 99 wt %, and a content of silver may be 1 wt % to 50 wt %, 1 wt % to 30 wt %, or 1 wt % to 20 wt % based on the total content of the conductive metal component included in the electrode.

As another example, the electrode according to the present disclosure is a copper-based electrode formed from the copper-based particle, which is a conductive metal included in the conductive paste composition, wherein a $\Delta$ resistivity index (a resistivity variation index=resistivity after 500 hours/initial resistivity) after 500 hours at a temperature of 85° C. and a relative humidity of 85% may be 1.0 or less, 0.5 to 1.0, or 0.8 to 1.0. Here, the $\Delta$ resistivity index is relevant to a change in the resistivity due to oxidation of the electrode and reduction in lifespan of the electrode accordingly when the electrode is installed in an electric/electronic apparatus to be used, and is exposed to the external environment. When the $\Delta$ resistivity index is 1.0, the resistivity is not changed when exposed to the external environment, and further, as the resistivity is lower than 1.0, the resistivity of the electrode is rather decreased, and thus, weather resistance, lifespan and durability of the electrode may be excellent. That is, when the electrode is exposed to the external environment, the resistivity is generally increased due to oxidation of the electrode. However, the resistivity of the electrode formed using the conductive paste composition according to the present disclosure is rather reduced, and thus, the electrode may have excellent electrical conductivity while simultaneously having excellent weather resistance.

According to an exemplary embodiment of the present disclosure, after 500 hours at a temperature of 85° C. and a relative humidity of 85%, the electrode may have the resistivity of less than $7.8 \times 10^{-5}$ $\Omega \cdot cm$, $7.2 \times 10^{-5}$ $\Omega \cdot cm$ or less, $5.2 \times 10^{-5}$ $\Omega \cdot cm$ or less, $8.2 \times 10^{-6}$ $\Omega \cdot cm$ or less, $7.6 \times 10^{-6}$ $\Omega \cdot cm$ or less, or $5.6 \times 10^{-6}$ $\Omega \cdot cm$ or less. Within this range, the electrode exposed to the outside is excellent in weather resistance, and thus, the electrode may have excellent lifespan and durability.

Further, according to an exemplary embodiment of the present disclosure, the electrode may have an initial resistivity of less than $7.8 \times 10^{-5}$ $\Omega \cdot cm$, $7.2 \times 10^{-5}$ $\Omega \cdot cm$ or less, $5.2 \times 10^{-5}$ $\Omega \cdot cm$ or less, $1.0 \times 10^{-5}$ $\Omega \cdot cm$ or less, $9 \times 10^{-6}$ $\Omega \cdot cm$ or less, $7.2 \times 10^{-6}$ $\Omega \cdot cm$ or less, or $5.8 \times 10^{-6}$ $\Omega \cdot cm$ or less. Within this range, the electrode may have excellent efficiency. Here, the initial resistivity may be resistivity before the electrode is exposed to the external environment after the electrode is formed, and the resistivity means a resistance value per unit length per unit area.

The electrode according to an exemplary embodiment of the present disclosure may be an electrode of an apparatus selected from the group consisting of a digitizer, a flexible printed circuit board (FPCB), a low temperature co-fired ceramic (LTCC), a multilayer ceramic condenser (MLCC), and a solar cell, etc.

As a specific example, when the electrode is used in a solar cell, the electrode may be used as a front electrode 30 of a solar cell (see FIG. 1). At this time, the solar cell may be a silicon-based solar cell using a single crystal silicon wafer, or a polycrystalline silicon wafer, or a thin film silicone. The single crystal silicon wafer may be formed by a pulling method, or the like, and the polycrystalline silicon wafer may be formed by a casting method, or the like. After the silicone ingot formed by the impression method or the casting method is cut to a predetermined thickness, it may be cleaned by etching the surface with sodium hydroxide (NaOH), potassium hydroxide (KOH), hydrofluoric acid, or the like. When a p-type silicon wafer is used, the n-layer may be formed by diffusing a pentavalent element such as phosphorus (P), and a depth of the diffusion layer may be adjusted according to a diffusion temperature, and time, etc. An anti-reflection film 20 may be formed on the n-layer, and the anti-reflection film 20 may reduce reflectance on the surface of the solar cell with respect to incident light to increase a light absorption amount, thereby increasing generation of a current. Here, the anti-antireflection film may be at least one single layer film or at least one multilayer selected from the group consisting of $SiN_x$, $TiO_2$, $SiO_2$, MgO, ITO, $SnO_2$, ZnO, etc., and may be formed by a thin film deposition process such as sputtering and chemical vapor deposition, etc. The electrode according to the present disclosure may be formed as a front electrode 30 on the thus-formed anti-reflection film. The electrode is formed by printing the conductive paste composition in a predetermined pattern through screen printing, followed by drying using an infrared ray drying furnace, and firing, and the electrode may be connected to the n-layer through the anti-reflection film at the time of firing. Further, the conductive paste composition which is usable as a back electrode on a rear surface of the wafer, for example, an aluminum paste composition, etc., may be printed, and dried by the same method, and then the cell in which the conductive paste composition for forming the front electrode is dried may be fired using a firing furnace and fired together with the front electrode to form the rear electrode.

Hereinafter, the present disclosure will be described in detail with reference to the following Examples. The following embodiments describe the present disclosure by way of example only. It is apparent to those skilled in the art that various changes and modifications can be made in the scope and spirit of the present disclosure and that the present disclosure is not limited thereto.

EXAMPLE

Example 1

<Preparation of Boron-Based Particle>

10 ml of boron powder (product name: B95 prepared by Unitech Corporation) was added into PULVERISETTE 6 Mono Mill (Frisch, Germany) provided with a grinding bowl made of zirconium oxide having a size of 80 ml and a grinding bowl made of zirconium oxide having a size of 1 mm and crushed at 500 rpm for 1 hour under a dry condition, thereby preparing a boron-based particle.

<Preparation of Conductive Paste Composition>

The above-prepared boron-based particle, a copper particle (product name: CUSP20 prepared by Join M Company) and a binder (an ethyl cellulose resin; a solvent: butyl carbitol, 1-dodecanol) were mixed in contents shown in Table 1 below to prepare a conductive paste composition as follows.

Ethyl cellulose N300 and N22 were mixed at a weight ratio of 3.76:7.52 and used as the resin of the binder, and butyl carbitol and 1-dodecanol were mixed at a weight ratio of 53:35 and used as the solvent. The binder resin was mixed with the binder resin, and stirred for 3 days, followed by aging for 24 hours or more to remove bubbles, thereby preparing a binder. The boron-based particle and the copper particle were mixed and linearly dispersed in the prepared binder, followed by treatment using 3-roll mill equipment five times by adjusting an interval between rolls, to thereby prepare a conductive paste composition. Then, the prepared conductive paste composition was subjected to aging for 24 hours or more at room temperature (20° C. to 26° C.) to complete the conductive paste composition.

Example 2

Example 2 was performed in the same manner as in Example 1 except that the boron-based particle was crushed for 2 hours under a dry condition at the time of preparing the boron-based particle.

Example 3

Example 3 was performed in the same manner as in Example 1 except that the boron-based particle was crushed for 3 hours under a dry condition at the time of preparing the boron-based particle.

Example 4

Example 4 was performed in the same manner as in Example 1 except that the boron-based particle was crushed for 1 hour and 30 minutes under a dry condition at the time of preparing the boron-based particle.

Example 5

Example 5 was performed in the same manner as in Example 1 except that the boron-based particle, the copper particle and the binder were added to the contents shown in Table 1 below at the time of preparing the conductive paste composition.

Example 6

Example 6 was performed in the same manner as in Example 1 except that CUSP40 prepared by Join M Company as the copper particle was added to the content shown in Table 1 below.

Example 7

<Preparation of Boron-Based Particle>

10 ml of boron powder (product name: B95 prepared by Unitech Corporation) was added into PULVERISETTE 6 Mono Mill (Frisch, Germany) provided with a grinding bowl made of zirconium oxide having a size of 80 ml and a grinding bowl made of zirconium oxide having a size of 1 mm and crushed at 500 rpm for 1 hour under a dry condition, thereby preparing a boron-based particle.

<Preparation of Conductive Paste Composition>

The above-prepared boron-based particle, a copper-based particle (product name: CS03S prepared by Join M Company, and having an average particle diameter of 3 μm, and a silver atom content of 9 wt %), and a binder (an ethyl cellulose resin; a solvent: butyl carbitol, 1-dodecanol) were mixed in contents shown in Table 2 below to prepare a conductive paste composition as follows.

Ethyl cellulose N300 and N22 were mixed at a weight ratio of 3.76:7.52 and used as the resin of the binder, and butyl carbitol and 1-dodecanol were mixed at a weight ratio of 53:35 and used as the solvent. The binder resin was mixed with the binder resin, and stirred for 3 days, followed by aging for 24 hours or more to remove bubbles, thereby preparing a binder. The boron-based particle and the copper-based particle were mixed and linearly dispersed in the prepared binder, followed by treatment using 3-roll mill equipment five times by adjusting an interval between rolls, to thereby prepare a conductive paste composition. Then, the prepared conductive paste composition was subjected to aging for 24 hours or more at room temperature (20° C. to 26° C.) to complete the conductive paste composition.

Example 8

Example 8 was performed in the same manner as in Example 7 except that the boron-based particle was crushed for 2 hours under a dry condition at the time of preparing the boron-based particle.

Example 9

Example 9 was performed in the same manner as in Example 7 except that the boron-based particle was crushed for 3 hours under a dry condition at the time of preparing the boron-based particle.

Example 10

Example 10 was performed in the same manner as in Example 7 except that the boron-based particle was crushed for 1 hour and 30 minutes under a dry condition at the time of preparing the boron-based particle.

Example 11

Example 11 was performed in the same manner as in Example 7 except that the boron-based particle, the copper-based particle and the binder were added to the contents shown in Table 2 below at the time of preparing the conductive paste composition.

Example 12

Example 12 was performed in the same manner as in Example 7 except that CS03S (average particle diameter of 3 μm, and silver content of 3 wt %) prepared by Join M Company as the copper-based particle was added to the content shown in Table 2 below at the time of preparing the conductive paste composition.

Example 13

Example 13 was performed in the same manner as in Example 7 except that CS03S (average particle diameter of 3 µm, and silver content of 5 wt %) prepared by Join M Company as the copper-based particle was added to the content shown in Table 2 below at the time of preparing the conductive paste composition.

Comparative Example 1

Comparative Example 1 was performed in the same manner as in Example 1 except that the boron powder (product name: B95 prepared by Unitech Corporation) was added to the content shown in Table 3 below at the time of preparing the conductive paste composition without performing the preparation of the boron-based particle.

Comparative Example 2

Comparative Example 2 was performed in the same manner as in Example 1 except that the boron-based particle was crushed for 10 minutes under a wet condition at the time of preparing the boron-based particle. Here, ethanol was used as a solvent for wet-crushing.

Comparative Example 3

Comparative Example 3 was performed in the same manner as in Example 1 except that the boron-based particle was crushed for 30 minutes under a wet condition at the time of preparing the boron-based particle. Here, ethanol was used as a solvent for wet-crushing.

Comparative Example 4

Comparative Example 4 was performed in the same manner as in Example 1 except that the boron-based particle was crushed for 30 minutes under a dry condition at the time of preparing the boron-based particle.

Comparative Example 5

Comparative Example 5 was performed in the same manner as in Example 1 except that the boron-based particle, the copper particle and the binder were added to the contents shown in Table 3 below at the time of preparing the conductive paste composition.

Comparative Example 6

Comparative Example 6 was performed in the same manner as in Example 1 except that the copper particle and the binder were added to the contents shown in Table 3 below without performing the preparation of the boron-based particle, and without adding the boron powder at the time of preparing the conductive paste composition.

Comparative Example 7

Comparative Example 7 was performed in the same manner as in Example 1 except that the boron-based particle, the copper particle and the binder were added to the contents shown in Table 3 below at the time of preparing the conductive paste composition.

Comparative Example 8

Comparative Example 7 was performed in the same manner as in Example 7 except that the boron powder (product name: B95 prepared by Unitech Corporation) was added to the content shown in Table 4 below at the time of preparing the conductive paste composition without performing the preparation of the boron-based particle.

Comparative Example 9

Comparative Example 9 was performed in the same manner as in Example 7 except that the boron-based particle was crushed for 10 minutes under a wet condition at the time of preparing the boron-based particle. Here, ethanol was used as a solvent for wet-crushing.

Comparative Example 10

Comparative Example 10 was performed in the same manner as in Example 7 except that the boron-based particle was crushed for 30 minutes under a wet condition at the time of preparing the boron-based particle. Here, ethanol was used as a solvent for wet-crushing.

Comparative Example 11

Comparative Example 11 was performed in the same manner as in Example 7 except that the boron-based particle was crushed for 30 minutes under a dry condition at the time of preparing the boron-based particle.

Comparative Example 12

Comparative Example 12 was performed in the same manner as in Example 7 except that the boron-based particle, the copper-based particle and the binder were added to the contents shown in Table 4 below at the time of preparing the conductive paste composition.

Comparative Example 13

Comparative Example 13 was performed in the same manner as in Example 7 except that the copper-based particle and the binder were added to the contents shown in Table 4 below without performing the preparation of the boron-based particle, and without adding the boron powder at the time of preparing the conductive paste composition.

Comparative Example 14

Comparative Example 14 was performed in the same manner as in Example 7 except that the boron-based particle, the copper-based particle and the binder were added to the contents shown in Table 4 below at the time of preparing the conductive paste composition.

Comparative Example 15

Comparative Example 15 was performed in the same manner as in Example 7 except that copper-based particle and silver particle (product name: SP-030S prepared by JC Metal Co., Ltd., having an average particle diameter of 3 µm) instead of the copper-based particle were added to the contents shown in Table 4 at the time of preparing the conductive paste composition.

Comparative Example 16

Comparative Example 16 was performed in the same manner as in Example 7 except that copper-based particle and silver particle (product name: SP-030S prepared by JC Metal Co., Ltd., having an average particle diameter of 3 µm) instead of the copper-based particle were added to the contents shown in Table 4 at the time of preparing the conductive paste composition.

TABLE 3

| Classification | Comparative Example | | | | | | |
|---|---|---|---|---|---|---|---|
| | 1 | 2 | 3 | 4 | 5 | 6 | 7 |
| Copper particle (wt %) | 83 | 83 | 83 | 85 | 89 | 87 | 77 |
| Boron-based particle (wt %) | 7 | 7 | 7 | 5 | 1 | — | 13 |
| Binder (wt %) | 10 | 10 | 10 | 10 | 10 | 13 | 10 |
| Sum (wt %) | 100 | 100 | 100 | 100 | 100 | 100 | 100 |
| Crushing time (min) | — | 10 | 30 | 30 | 60 | — | 60 |
| Crushing condition | — | Wet | Wet | Dry | Dry | — | Dry |

TABLE 4

| Classification | Comparative Example | | | | | | | | |
|---|---|---|---|---|---|---|---|---|---|
| | 8 | 9 | 10 | 11 | 12 | 13 | 14 | 15 | 16 |
| Copper-based particle (wt %) | 85 | 85 | 85 | 85 | 84 | 90 | 80 | 84.5 | 65 |
| Boron-based particle (wt %) | 5 | 5 | 5 | 5 | 1 | — | 10 | 5 | 5 |
| Silver particle (wt %) | — | — | — | — | — | — | — | 0.5 | 20 |
| Binder (wt %) | 10 | 10 | 10 | 10 | 10 | 10 | 10 | 10 | 10 |
| Sum (wt %) | 100 | 100 | 100 | 100 | 100 | 100 | 100 | 100 | 100 |
| Crushing time (min) | — | 10 | 30 | 30 | 60 | — | 60 | 60 | 60 |
| Crushing condition | — | Wet | Wet | Dry | Dry | — | Dry | Dry | Dry |

TABLE 1

| Classification | Example | | | | | |
|---|---|---|---|---|---|---|
| | 1 | 2 | 3 | 4 | 5 | 6 |
| Copper particle (wt %) | 83 | 83 | 83 | 83 | 81 | 88 |
| Boron-based particle (wt %) | 7 | 7 | 7 | 7 | 9 | 2 |
| Binder (wt %) | 10 | 10 | 10 | 10 | 10 | 10 |
| Sum (wt %) | 100 | 100 | 100 | 100 | 100 | 100 |
| Crushing time (min) | 60 | 120 | 180 | 90 | 60 | 60 |
| Crushing condition | Dry | Dry | Dry | Dry | Dry | Dry |

TABLE 2

| Classification | Example | | | | | | |
|---|---|---|---|---|---|---|---|
| | 7 | 8 | 9 | 10 | 11 | 12 | 13 |
| Copper-based particle (wt %) | 85 | 85 | 85 | 85 | 85 | 85 | 85 |
| Boron-based particle (wt %) | 5 | 5 | 5 | 5 | 7 | 5 | 5 |
| Binder (wt %) | 10 | 10 | 10 | 10 | 10 | 10 | 10 |
| Sum (wt %) | 100 | 100 | 100 | 100 | 100 | 100 | 100 |
| Crushing time (min) | 60 | 120 | 180 | 90 | 60 | 60 | 60 |
| | Dry | Dry | Dry | Dry | Dry | Dry | Dry |

EXPERIMENTAL EXAMPLE

Experimental Example 1

The boron-based particles prepared in Examples 1 to 13 and Comparative Examples 1 to 5, 7 to 12 and 14 to 16 were confirmed by XRD (Cu Kα characteristic X-ray wavelength 1.541 Å) and a scanning electron microscopy, and each specific surface area of the boron-based particles was measured by the following method and shown in Tables 5 to 8 below.

*Specific surface area ($m^2/g$): The specific surface area of the powdery sample was measured based on a measurement method according to gaseous nitrogen adsorption using a Micrometrics 2020 apparatus.

TABLE 5

| Classification | Example | | | | | |
|---|---|---|---|---|---|---|
| | 1 | 2 | 3 | 4 | 5 | 6 |
| Boron content in particle (wt %) | 92.59 | 88.73 | 88.53 | 90.74 | 92.59 | 92.59 |
| Oxygen content in particle (wt %) | 7.41 | 11.27 | 11.47 | 9.26 | 7.41 | 7.41 |
| Sum (wt %) | 100 | 100 | 100 | 100 | 100 | 100 |
| Specific surface area ($m^2/g$) | 13.24 | 13.9 | 13.94 | 13.37 | 13.24 | 13.24 |

TABLE 6

| Classification | Example | | | | | | |
|---|---|---|---|---|---|---|---|
| | 7 | 8 | 9 | 10 | 11 | 12 | 13 |
| Boron content in particle (wt %) | 92.59 | 88.73 | 88.53 | 90.74 | 92.59 | 92.59 | 92.59 |
| Oxygen content in particle (wt %) | 7.41 | 11.27 | 11.47 | 9.26 | 7.41 | 7.41 | 7.41 |
| Sum (wt %) | 100 | 100 | 100 | 100 | 100 | 100 | 100 |
| Specific surface area (m$^2$/g) | 13.24 | 13.9 | 13.94 | 13.37 | 13.24 | 13.24 | 13.24 |

TABLE 7

| Classification | Comparative Example | | | | | | |
|---|---|---|---|---|---|---|---|
| | 1 | 2 | 3 | 4 | 5 | 6 | 7 |
| Boron content in particle (wt %) | 94.60 | 94.65 | 94.57 | 94.34 | 92.59 | — | 92.59 |
| Oxygen content in particle (wt %) | 0.87 | 1.24 | 1.29 | 1.91 | 7.41 | — | 7.41 |
| Sum (wt %) | 100 | 100 | 100 | 100 | 100 | — | 100 |
| Specific surface area (m$^2$/g) | 9.56 | 19.91 | 22.19 | 11.03 | 13.24 | — | 13.24 |

TABLE 8

| Classification | Comparative Example | | | | | | | | |
|---|---|---|---|---|---|---|---|---|---|
| | 8 | 9 | 10 | 11 | 12 | 13 | 14 | 15 | 16 |
| Boron content in particle (wt %) | 94.60 | 94.65 | 94.57 | 94.34 | 92.59 | — | 92.59 | 92.59 | 92.59 |
| Oxygen content in particle (wt %) | 0.87 | 1.24 | 1.29 | 1.91 | 7.41 | — | 7.41 | 7.41 | 7.41 |
| Sum (wt %) | 100 | 100 | 100 | 100 | 100 | — | 100 | 100 | 100 |
| Specific surface area (m$^2$/g) | 9.56 | 19.91 | 22.19 | 11.03 | 13.24 | — | 13.24 | 13.24 | 13.24 |

Figure 4:
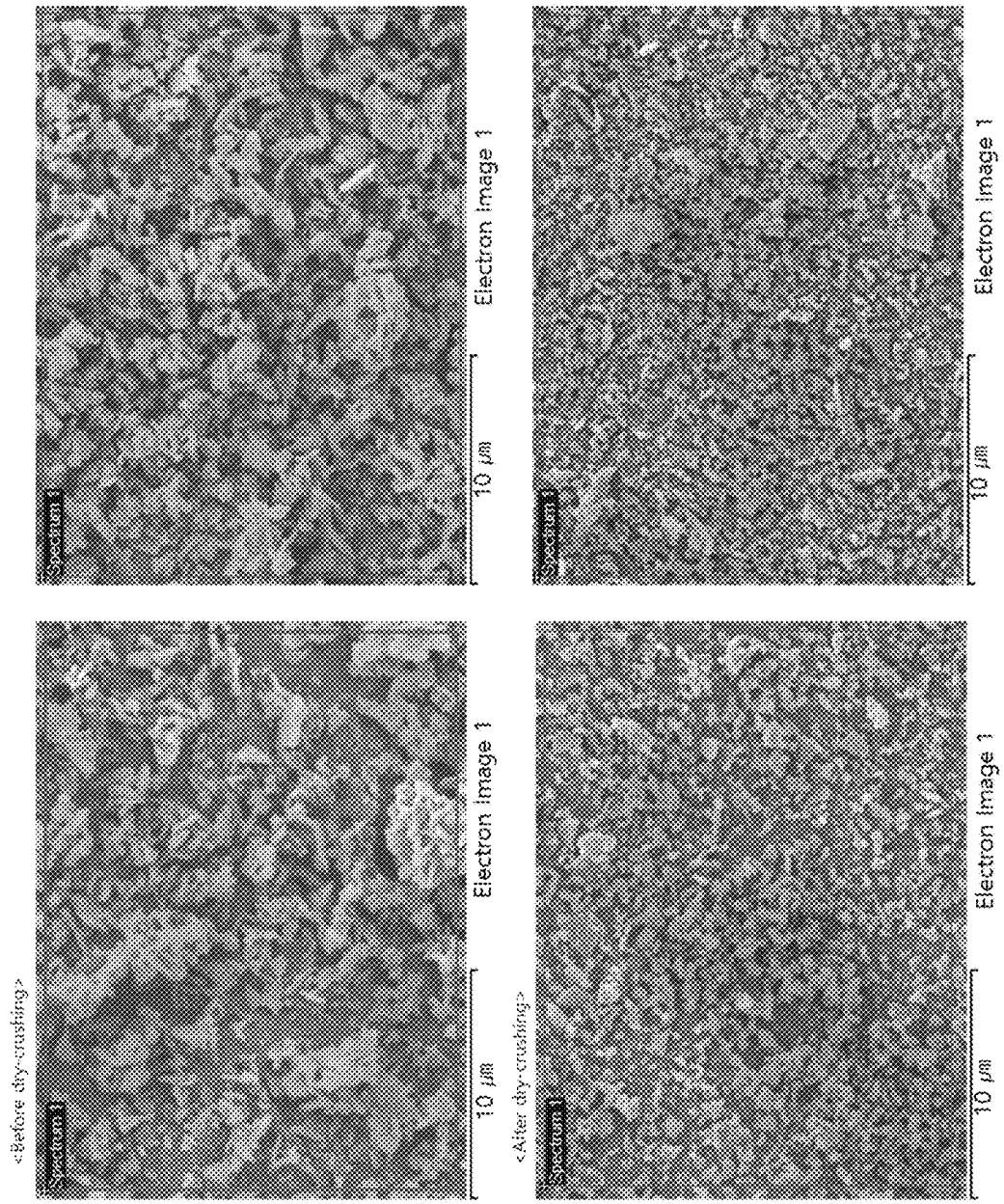
FIG. 4 shows scanning electron microscopy (SEM) images of the boron-based particles according to Examples 1 and 7 of the present disclosure before and after dry-crushing.
Figure 5:
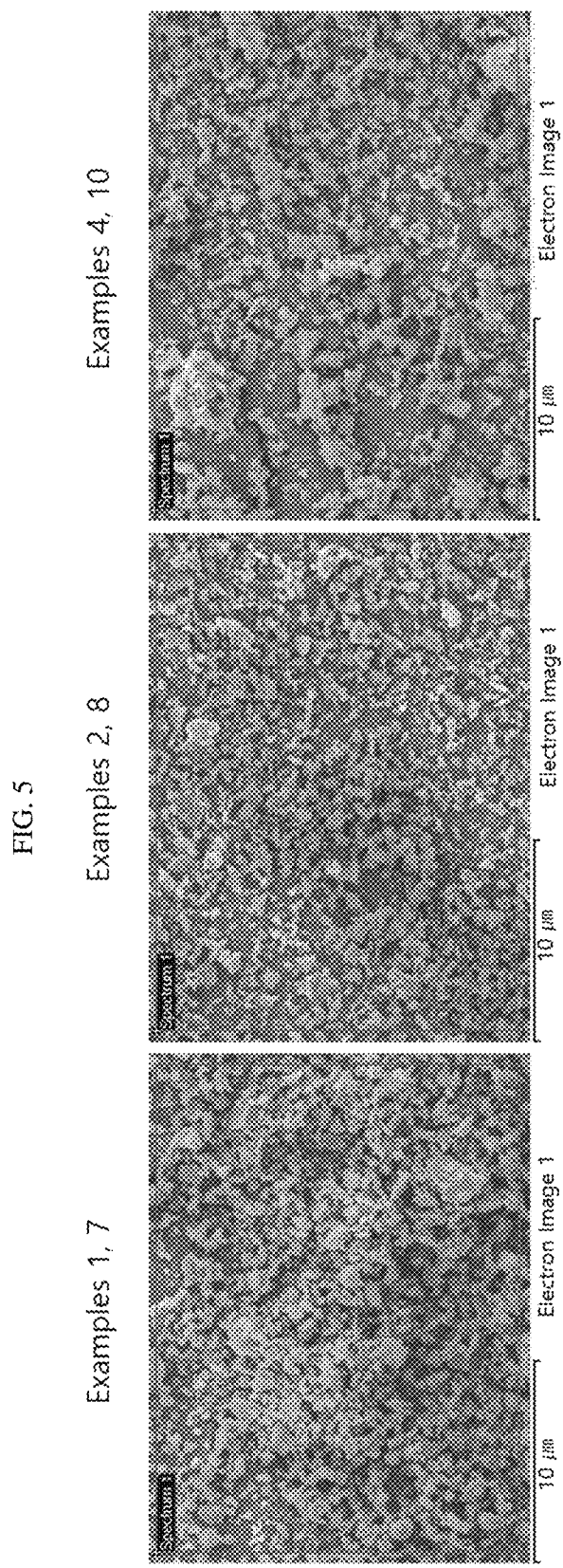
FIG. 5 shows scanning electron microscopy (SEM) images of the boron-based particles according to Examples 1, 2, 4, 7, 8 and 10 of the present disclosure after dry-crushing.
Figure 6:
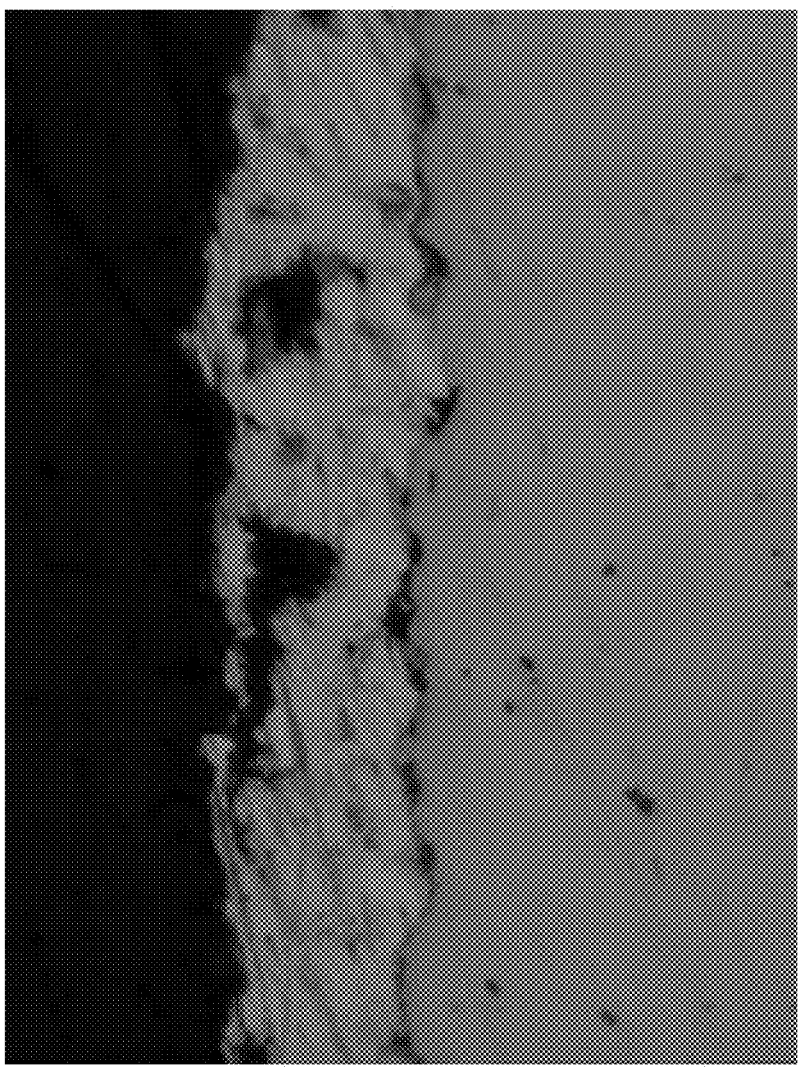
FIG. 6 shows a scanning electron microscopy image of a cross section of an electrode formed by using a conductive paste composition according to Example 1 of the present disclosure.

As shown in Tables 5 to 8, it could be confirmed that in Examples 1 to 13 in which the boron-based particle was subjected to the dry-crushing process according to the present disclosure, the surface of the particle was partially or entirely oxidized and coated with boron oxide, and thus, the oxygen content in the particle was increased, and the average particle diameter was decreased by the crushing, thereby increasing the specific surface area as compared to Comparative Examples 1 and 8 using the boron powder containing oxygen as it is as impurities. On the other hand, it could be confirmed that in Comparative Examples 2, 3, 9 and 10 in which the crushing was performed by wet crushing, the specific surface area was remarkably increased, but the increase in the oxygen content in the particle was not significant, and in Comparative Examples 4 and 11 in which even though the dry-crushing was performed, the crushing time was not sufficient, and not only the increased amount of the oxygen content in the particle was small but also the increased amount of the specific surface area was not significant (see FIGS. 4 and 5).

Experimental Example 2

The conductive paste compositions prepared in Examples 1 to 13 and Comparative Examples 1 to 16 were used and applied on a silicon wafer by screening through a thick film process, wherein a plate size was 500-16 mesh, followed by heat treatment under an atmospheric condition, and then, the resistivity was measured by the following method and shown in Tables 9 to 12. The heat treatment was performed at a temperature of 800 to 900° C., which is the same general condition at which a silver paste composition for a solar cell is used and sintered.

*Resistivity (Ω·cm): The prepared electrode was cut into a size of 1 cm (length)×200 μm (height), a sheet resistance was measured using a 4 probe point, and a thickness of the same electrode was measured and multiplied by the measured sheet resistance, thereby calculating the resistivity. Here, the sheet resistance was measured using a LORESTA-GP/MCP-T610 sheet resistance meter manufactured by Mitsubishi Chemical., and an electrode thickness was measured using a DIGIMICRO MF 501 thickness meter manufactured by Nikon Metrology. Here, when the measurement was impossible due to high resistivity, it was marked as Over load.

TABLE 9

| Classification | Example | | | | | |
|---|---|---|---|---|---|---|
| | 1 | 2 | 3 | 4 | 5 | 6 |
| Resistivity ($\Omega \cdot cm$) | $1.23 \times 10^{-5}$ | $1.31 \times 10^{-5}$ | $1.26 \times 10^{-5}$ | $1.24 \times 10^{-5}$ | $5.2 \times 10^{-5}$ | $7.2 \times 10^{-5}$ |
| Average electrode thickness ($\mu m$) | 12.1 | 13.2 | 12.5 | 12.6 | 15.3 | 15.3 |

TABLE 10

| Classification | Example | | | | | | |
|---|---|---|---|---|---|---|---|
| | 7 | 8 | 9 | 10 | 11 | 12 | 13 |
| Resistivity ($\Omega \cdot cm$) | $7.4 \times 10^{-6}$ | $7.1 \times 10^{-6}$ | $6.7 \times 10^{-6}$ | $6.5 \times 10^{-6}$ | $5.3 \times 10^{-6}$ | $8.88 \times 10^{-6}$ | $9.96 \times 10^{-6}$ |
| Average electrode thickness ($\mu m$) | 20.1 | 15.7 | 16.9 | 18.4 | 7.8 | 12.3 | 14.5 |

TABLE 11

| Classification | Comparative Example | | | | | | |
|---|---|---|---|---|---|---|---|
| | 1 | 2 | 3 | 4 | 5 | 6 | 7 |
| Resistivity ($\Omega \cdot cm$) | $5.4 \times 10^{-5}$ | $3.2 \times 10^{-4}$ | $3.8 \times 10^{-4}$ | $7.8 \times 10^{-5}$ | $3.4 \times 10^{-3}$ | Over load | $4.7 \times 10^{-4}$ |
| Average electrode thickness ($\mu m$) | 14.0 | 17.2 | 16.9 | 13.6 | 13.1 | 20.2 | 18.6 |

TABLE 12

| Classification | Comparative Example | | | | | | | | |
|---|---|---|---|---|---|---|---|---|---|
| | 8 | 9 | 10 | 11 | 12 | 13 | 14 | 15 | 16 |
| Resistivity ($\Omega \cdot cm$) | $1.75 \times 10^{-5}$ | Over load | Over load | Over load | Over load | Over load | $3.2 \times 10^{-5}$ | $1.28 \times 10^{-5}$ | $3.33 \times 10^{-5}$ |
| Average electrode thickness ($\mu m$) | 14.0 | 9.0 | 6.6 | 11.6 | 13.1 | 15.7 | 16.4 | 14.3 | 13.1 |

As shown in Tables 9 to 12, when the electrode was formed using the conductive paste composition according to the present disclosure, it could be confirmed that the electrode had low resistivity as $7.2 \times 10^{-5}$ $\Omega \cdot cm$ or less. In particular, it could be confirmed that Examples 7 to 13 had a significantly low resistivity as $1 \times 10^{-5}$ $\Omega \cdot cm$ or less.

Figure 7:
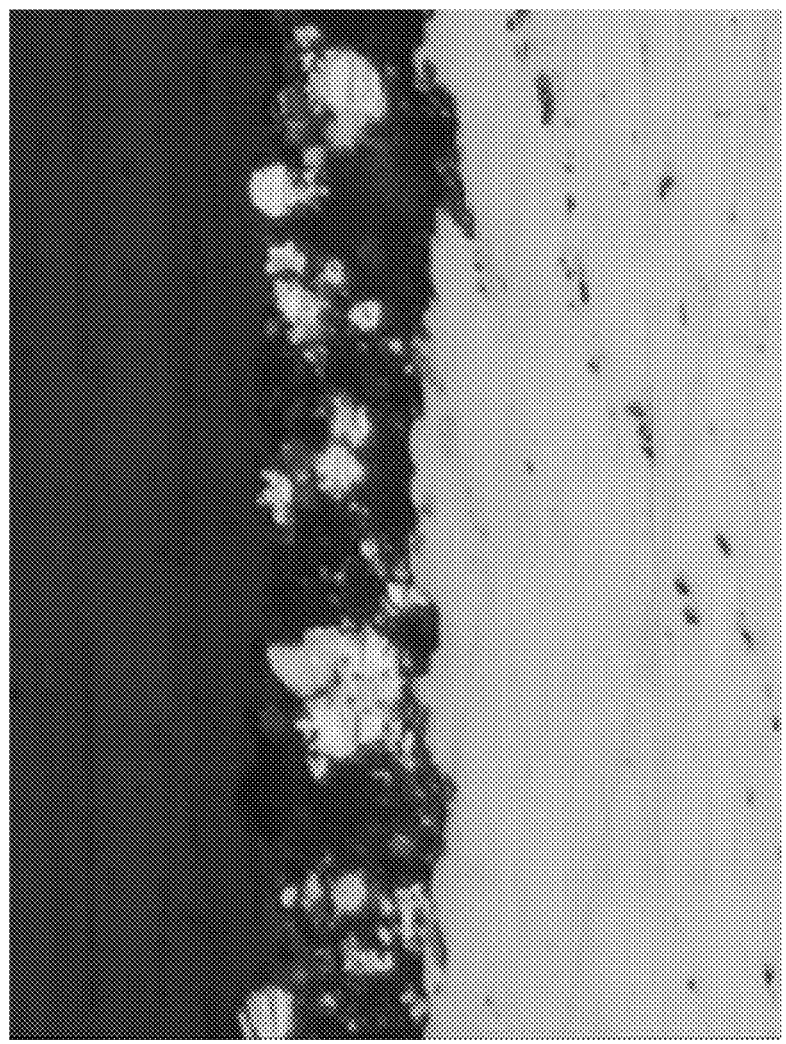
FIG. 7 shows a scanning electron microscopy image of a cross section of an electrode formed by using a conductive paste composition in which boron-based particles are excessively added according to Comparative Example 7 of the present disclosure.
Figure 8:
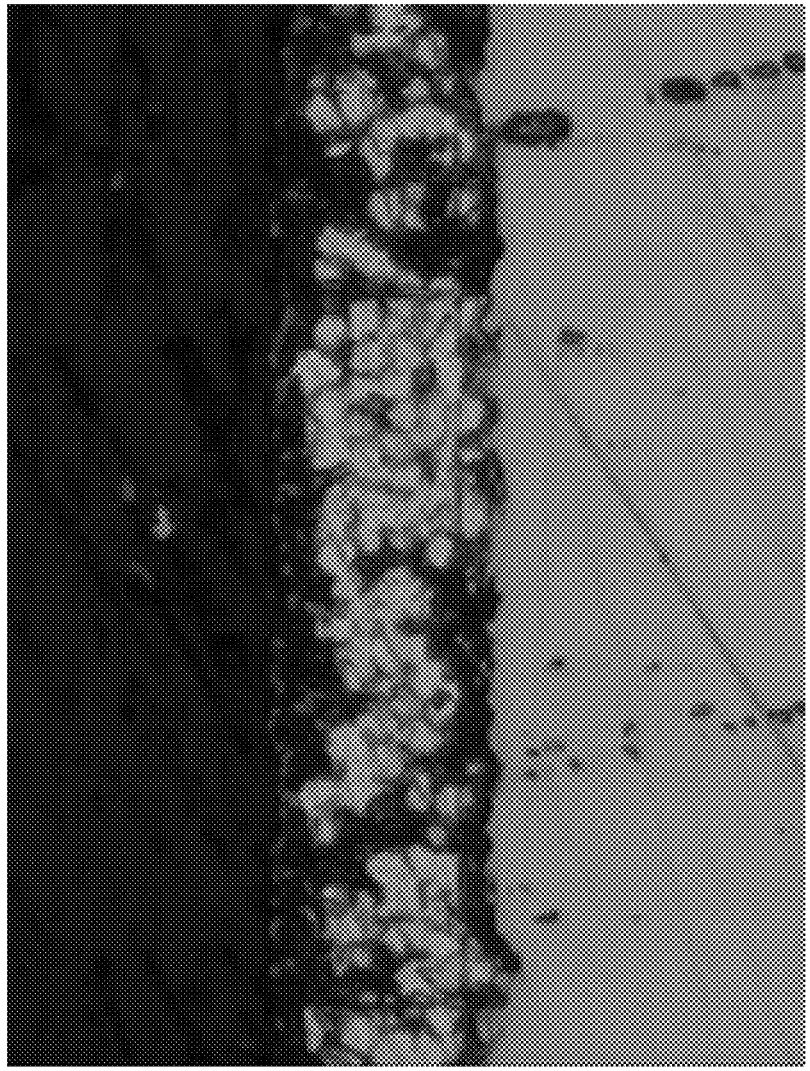
FIG. 8 shows a scanning electron microscopy image of a cross section of an electrode formed by using a conductive paste composition in which boron-based particles are not added according to Comparative Example 6 of the present disclosure.
Figure 9:
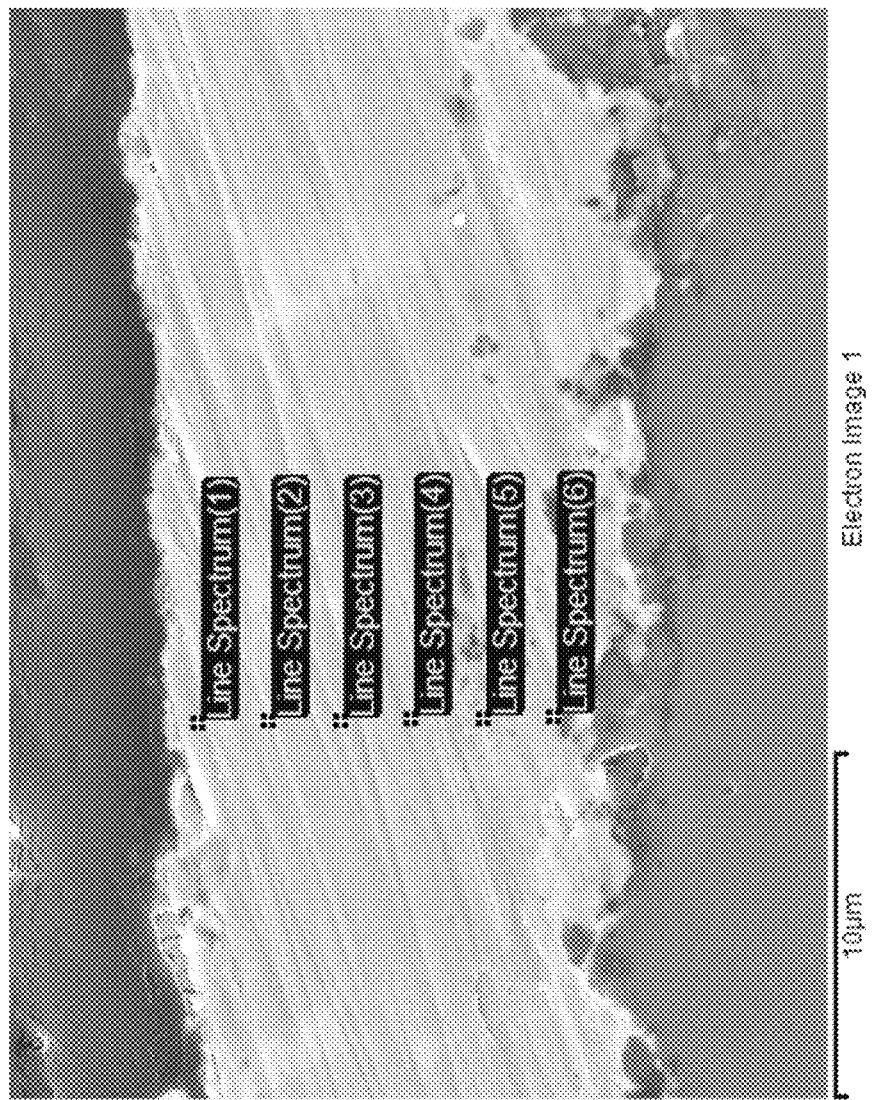
FIG. 9 shows a scanning electron microscopy image of a cross section of an electrode formed by using a conductive paste composition according to Example 7 of the present disclosure.
Figure 10:
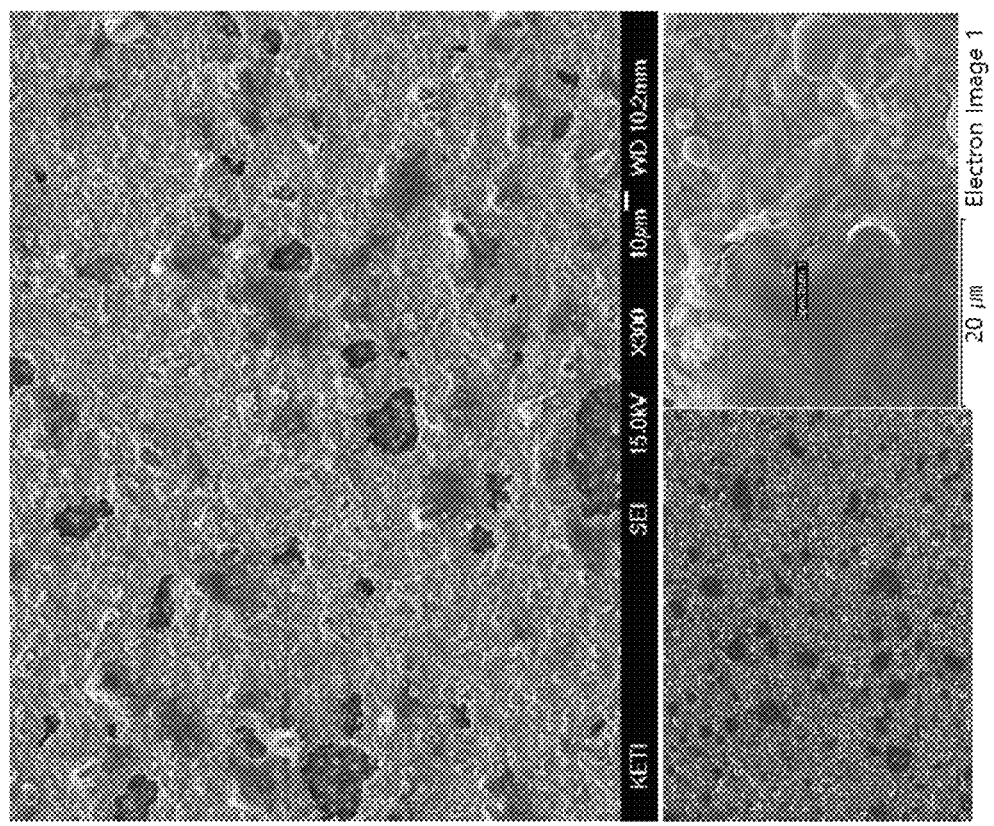
FIG. 10 shows a scanning electron microscopy image of a cross section of an electrode formed by using a conductive paste composition in which boron-based particles are excessively added according to Comparative Example 14 of the present disclosure.
Figure 11:
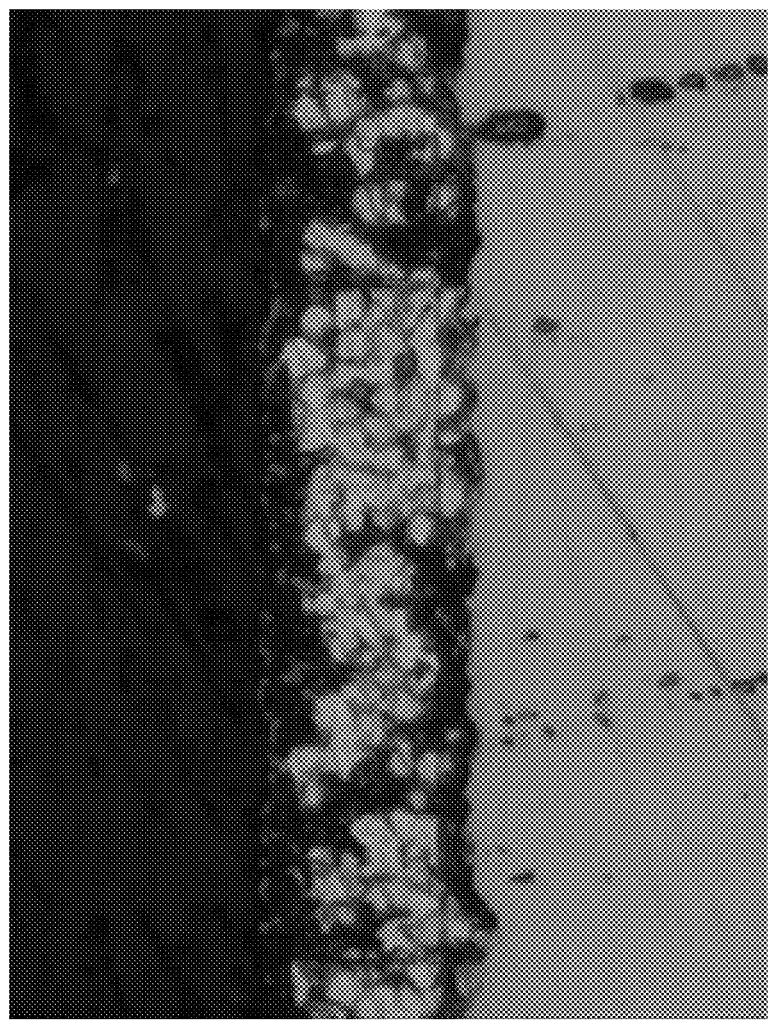
FIG. 11 shows a scanning electron microscopy image of a cross section of an electrode formed by using a conductive paste composition in which boron-based particles are not added according to Comparative Example 13 of the present disclosure.

Further, in Examples 1 and 7 prepared according to the present disclosure, the copper electrode which was not oxidized in a bulk form by necking the copper particles was produced. However, Comparative Example 1 which was not subjected to the crushing process had resistivity of $5.4 \times 10^{-5}$ $\Omega \cdot cm$, and Comparative Example 8 had relatively high resistivity as $1.75 \times 10^{-5}$ $\Omega \cdot cm$, Comparative Examples 2 to 5 had a very high resistivity as $7.8 \times 10^{-5}$ $\Omega \cdot cm$ or more. Comparative Examples 9 to 12 were over loaded, and thus, it was impossible to measure the resistivity. In Comparative Examples 6 and 13 in which the boron-based particle was not added, the copper particle was oxidized at the time of firing and the resistivity was also high (see FIGS. 8 and 11), and in Comparative Examples 7 and 14 in which the boron-based particle was added in an excessive amount, the generation of boron oxide was drastically increased at the time of firing, and the resistivity was increased (See FIGS. 7 and 10). Further, in Comparative Examples 15 and 16 in which some of the copper-based particles according to the present disclosure were substituted with silver particles, it was confirmed that the resistivity was rather increased.

Experimental Example 3

In order to analyze the active components of the electrodes (Examples 3 and 9) produced in Experimental Example 2, the analysis was performed based on X-ray Photoelectron Spectroscopy (XPS) binding energy measured in a vacuum chamber using a k-alpha XPS measurement instrument manufactured by the Thermo Company.

Figure 15:
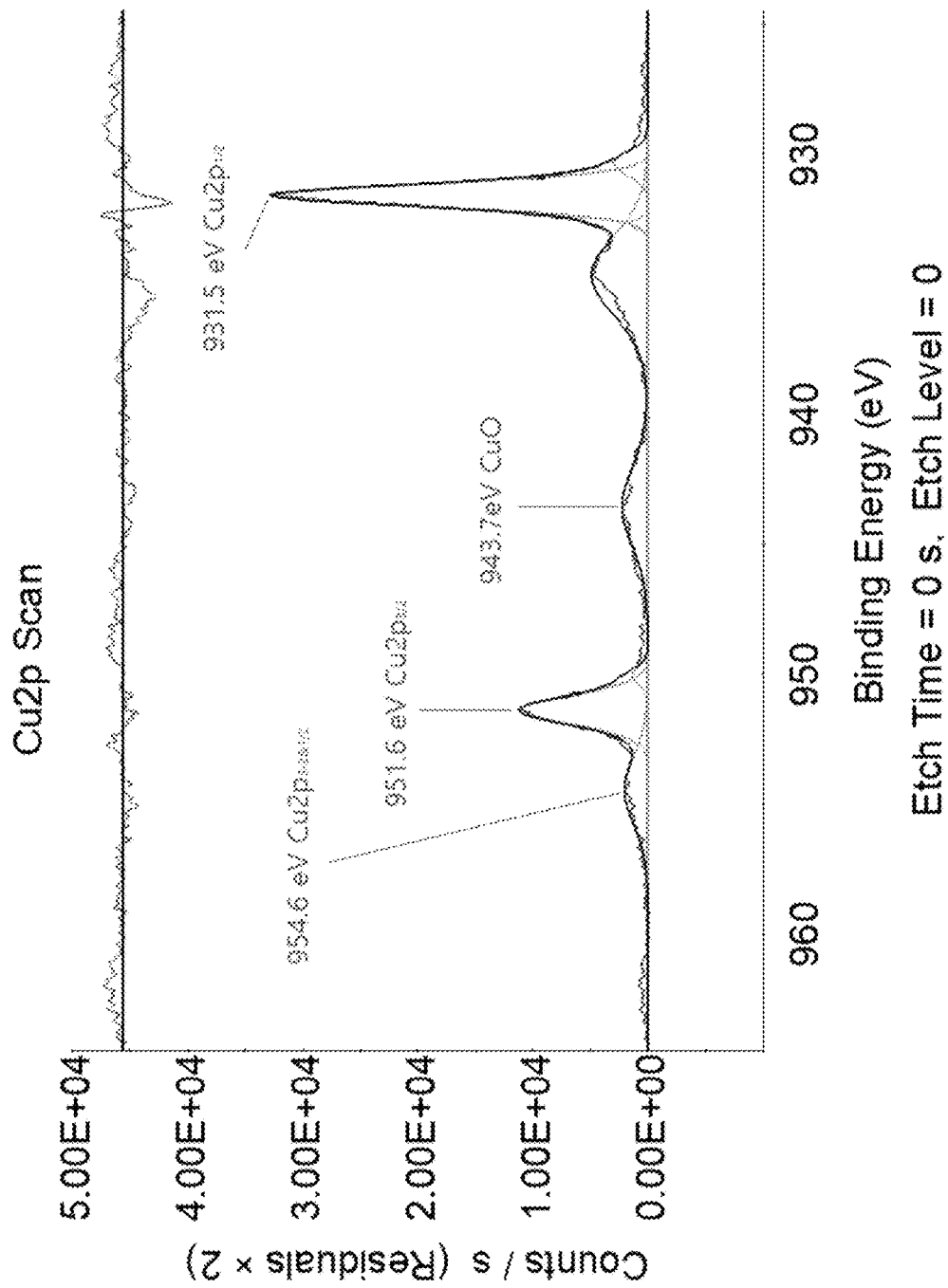
FIGS. 15 and 16 show XPS results (Cu 2p orbital, B 1s orbital) of the electrode produced according to Example 3 of the present disclosure.
Figure 16:
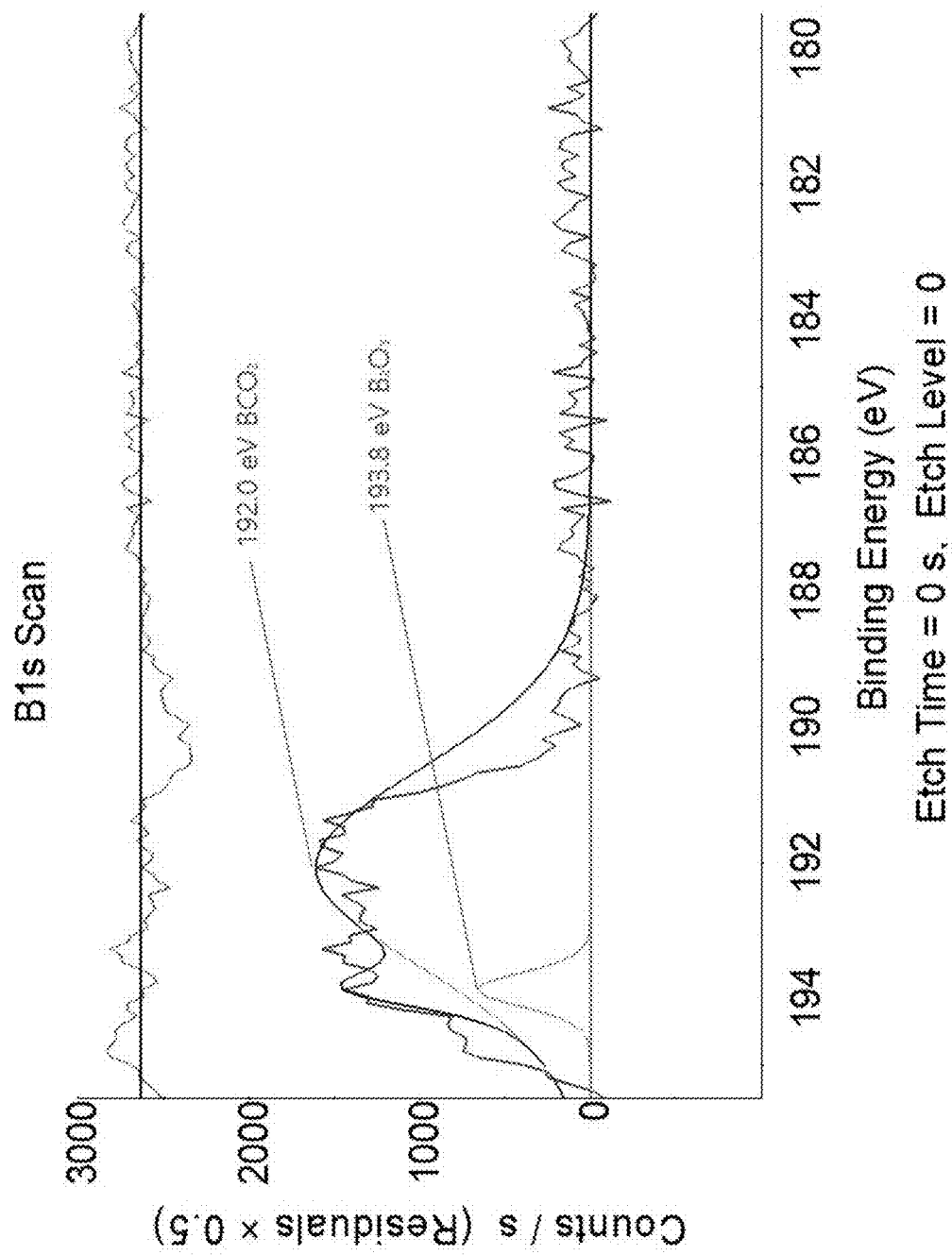

As a result of the analysis of the electrode produced in Example 3, it was confirmed that Cu, $B_2O_3$ and $BCO_2$ were included in the electrode, and specifically, main peaks for the Cu 2p orbital were shown at 951.6 eV $Cu2P_{3/2}$ and 931.5 eV $Cu2P_{1/2}$, and main peaks for the B is orbital were shown at 193.8 eV $B_2O_3$ and 192 eV $BCO_2$ (see FIGS. 15 and 16).

Figure 17:
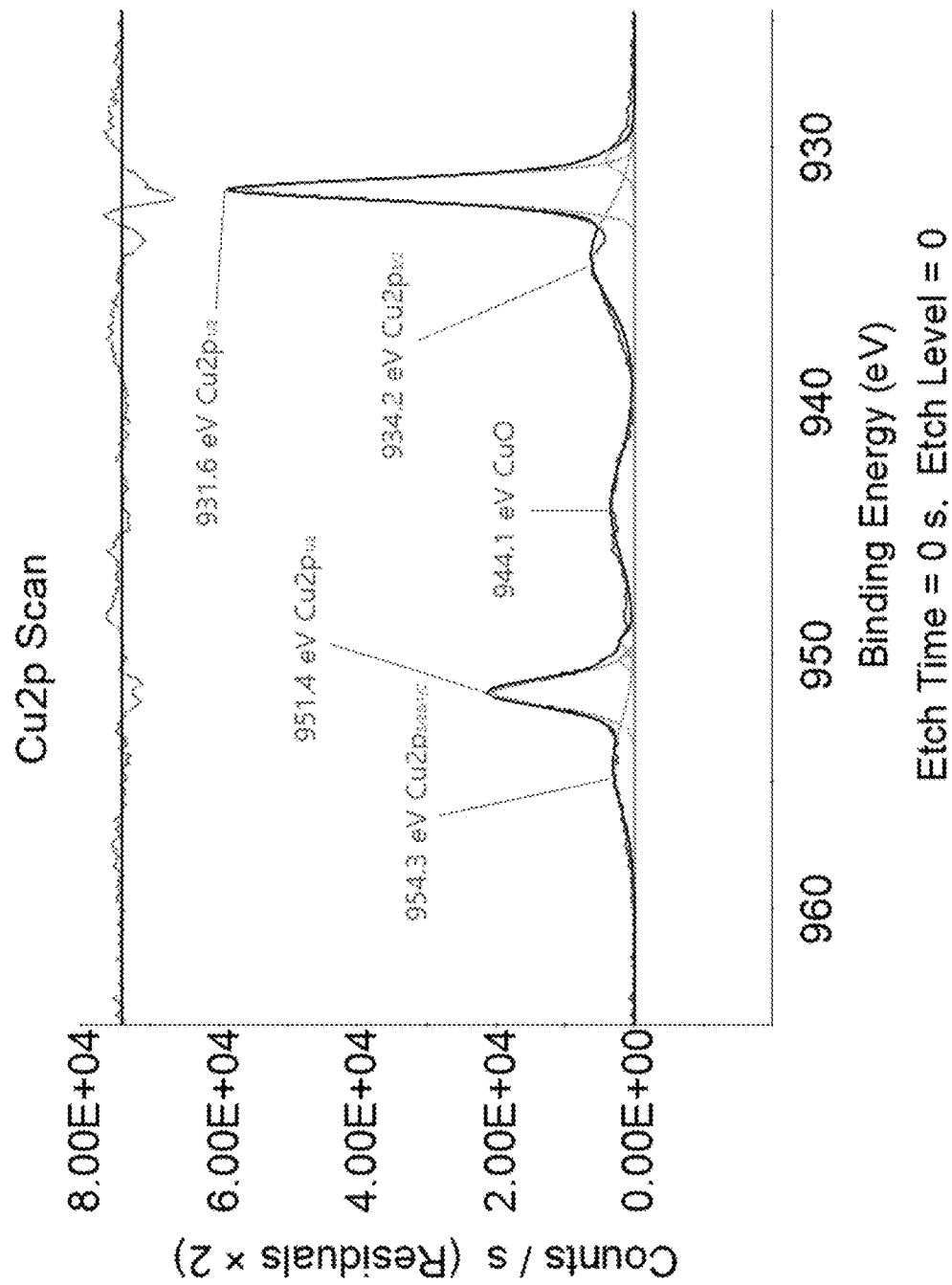
Figure 18:
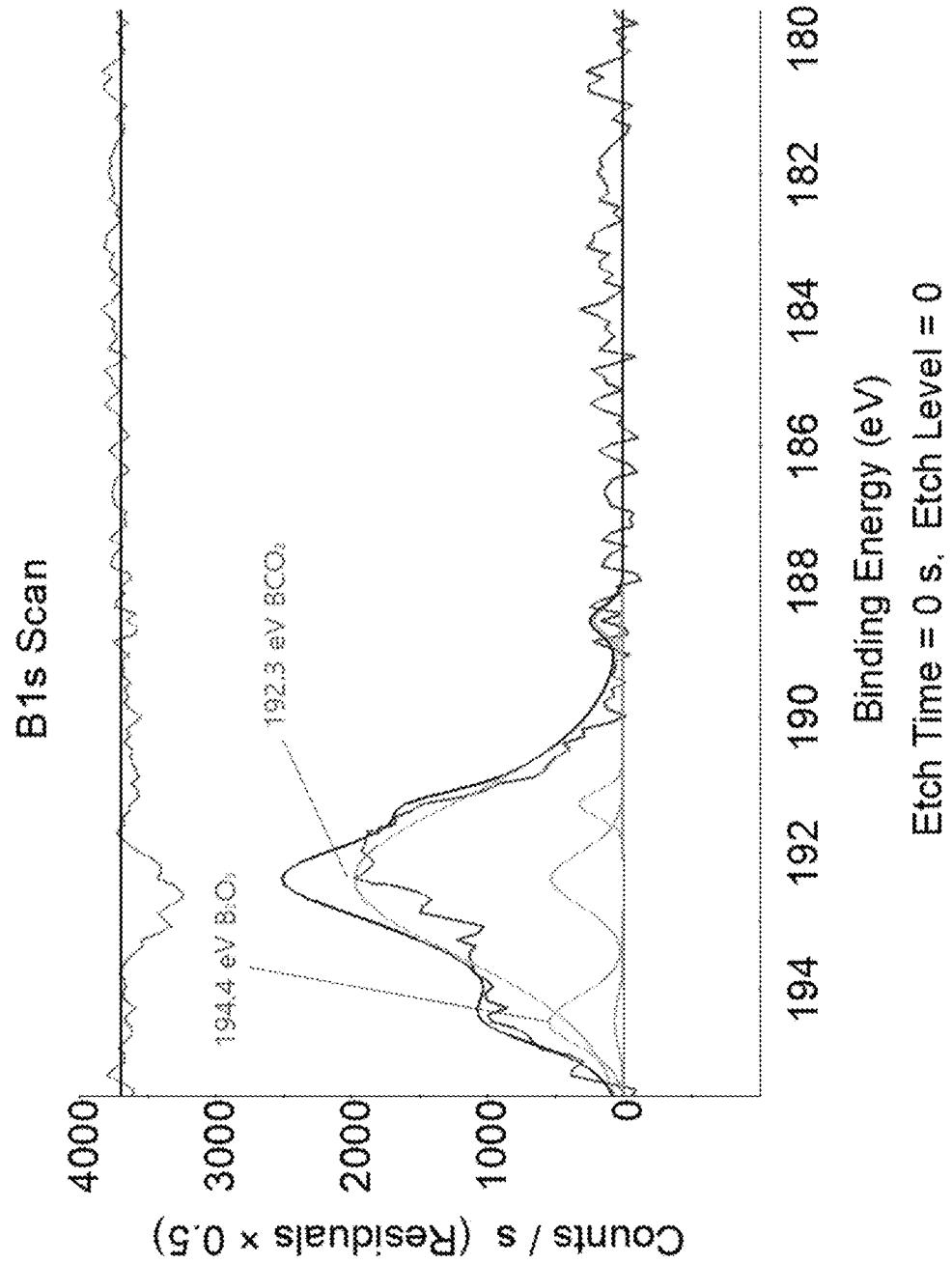

Further, as a result of analysis of the electrode prepared in Example 9, it was confirmed that Cu, Ag, $B_2O_3$, and $BCO_2$ were included in the electrode, and specifically, main peaks for the Cu 2p orbital were shown at 951.6 eV $Cu2P_{3/2}$ and 931.5 eV $Cu2P_{1/2}$, main peaks for the B is orbital were shown at 194.4 eV $B_2O_3$ and 192.3 eV $BCO_2$, and main peaks for the Ag 3d orbital were shown at 376.1 eV $Ag3d_{3/2}$, 373.8 eV $Ag3d_{5/2}$, 370.2 eV $Ag3d_{5/2}$, and 367.8 eV $Ag_2O$ (see FIGS. 17 to 19).

The peaks were referred to the documents "ACS Appl. Mater. Interfaces, 2015, 7 (33), pp 18450-18459" and "ACS Appl. Mater. Interfaces, 2016, 8, 11698-11710".

Experimental Example 4

In order to measure the weather resistance in connection with the lifespan and durability of the electrodes of the Examples and the Comparative Examples prepared in Experimental Example 2, the Δ resistivity was measured according to the following measurement method under severe conditions and shown in Tables 13 to 15 below.

*Weather resistance (severe condition): After 500 hours at a temperature of 85° C. and a relative humidity of 85%, the resistivity of the electrode produced in Experimental Example 2 was measured using a DOS8054S tester manufactured by Daewon Science Inc., and the Δ resistivity index (a resistivity variation index=resistivity after 500 hours/initial resistivity) was calculated. Here, when the initial resistivity was over loaded, it was marked as over load. A case where the Δ resistance index was more than 1 indicated that the resistivity was increased after the severe condition test, a case where the Δ resistance index was 1 indicated that the resistivity was not changed after the severe condition test, and a case where the Δ resistance index was less than 1 indicated that the resistivity was decreased after the severe condition test.

TABLE 13

| Classification | Example | | | |
|---|---|---|---|---|
| | 1 | 2 | 7 | 8 |
| Resistivity after 500 hours (Ω · cm) | $1.1 \times 10^{-5}$ | $1.27 \times 10^{-5}$ | $6.73 \times 10^{-6}$ | $6.48 \times 10^{-6}$ |
| Δ Resistivity index | 0.89 | 0.96 | 0.90 | 0.91 |

TABLE 14

| Classification | Comparative Example | | | | | |
|---|---|---|---|---|---|---|
| | 2 | 3 | 4 | 5 | 6 | 7 |
| Resistivity after 500 hours (Ω · cm) | Over load | Over load | Over load | Over load | Over load | $2.4 \times 10^{-3}$ |
| Δ Resistivity index | — | — | — | — | — | 5.1 |

TABLE 15

| Classification | Comparative Example | | | | |
|---|---|---|---|---|---|
| | 9 | 10 | 11 | 12 | 16 |
| Resistivity after 500 hours (Ω · cm) | Over load | Over load | Over load | Over load | $7.8 \times 10^{-5}$ |
| Δ Resistivity index | — | — | — | — | 2.34 |

Figure 12:
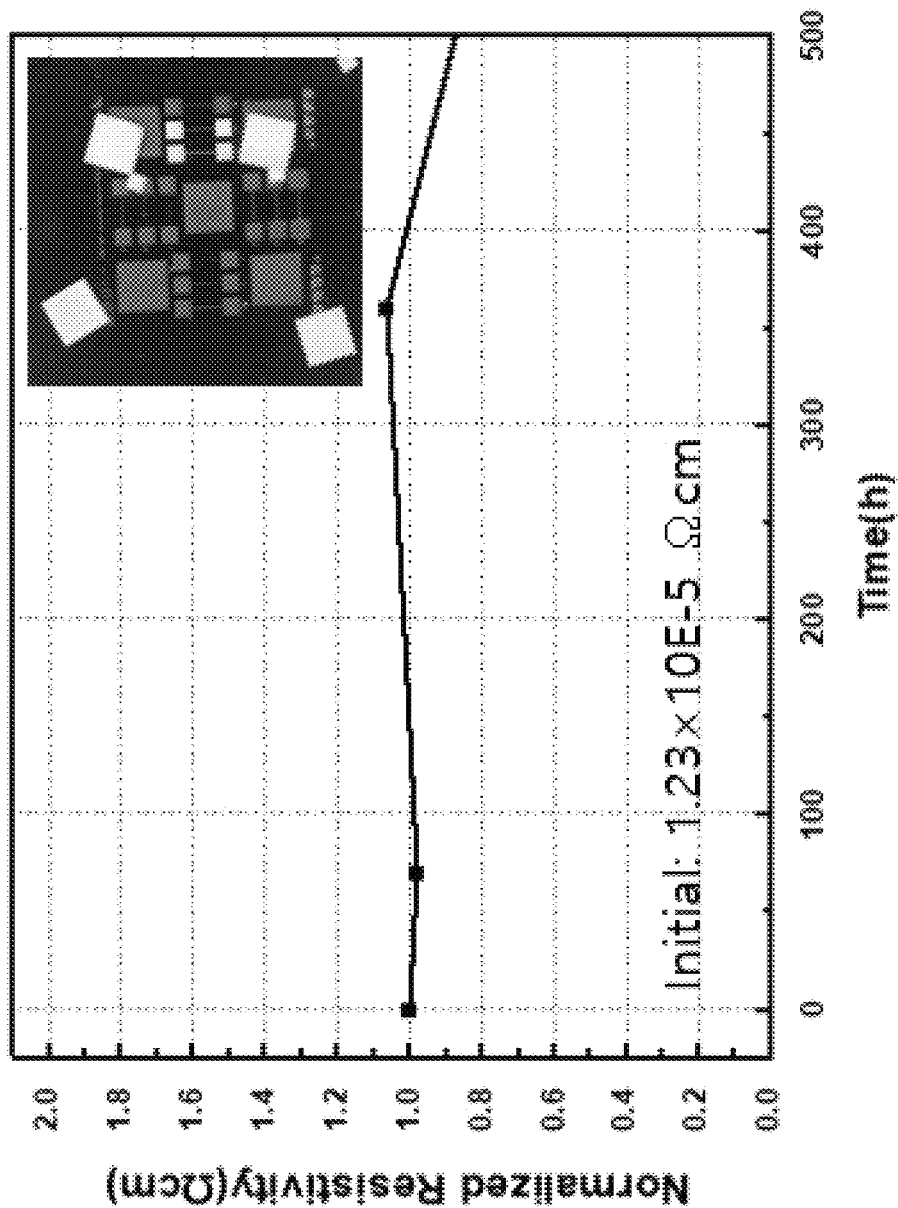
FIG. 12 shows the electrode formed by using the conductive paste composition according to Example 1 of the present disclosure, after a severe test.
Figure 13:
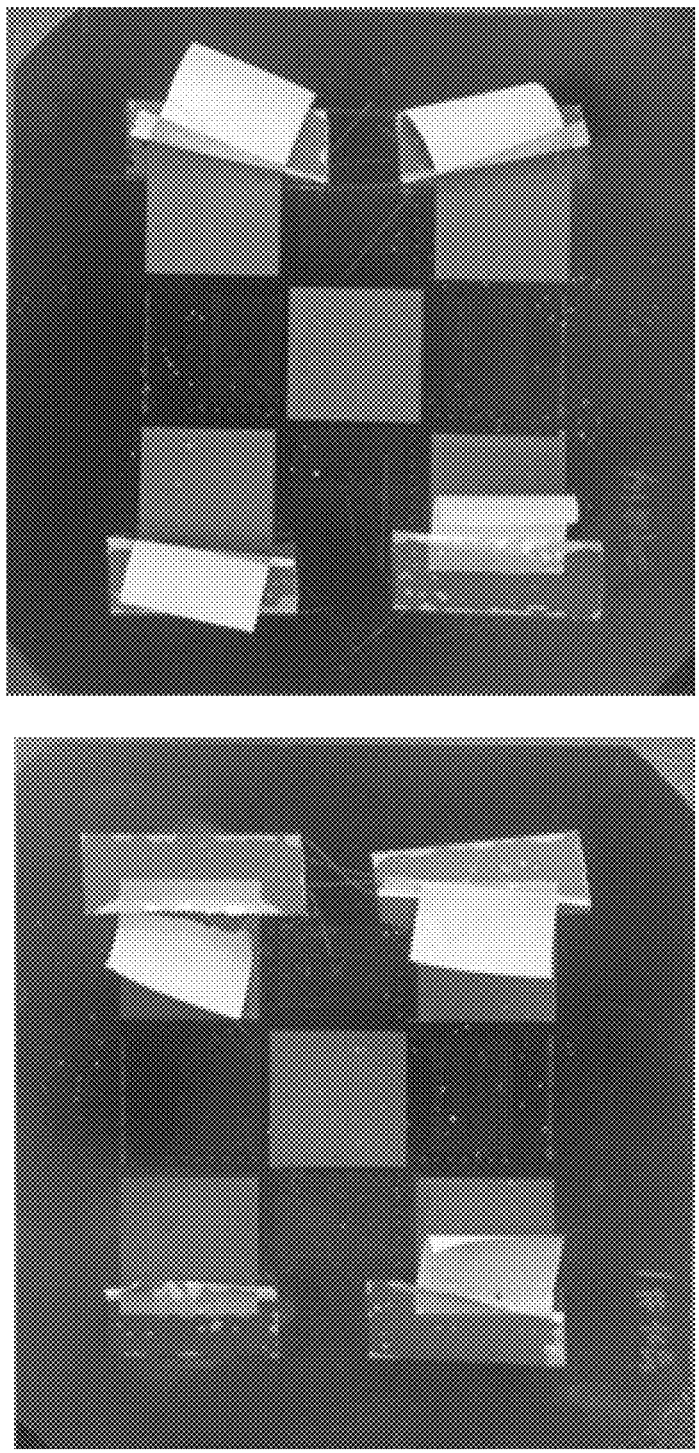
FIG. 13 shows the electrode formed by using the conductive paste composition according to Example 7 of the present disclosure, after a severe test.
Figure 14:
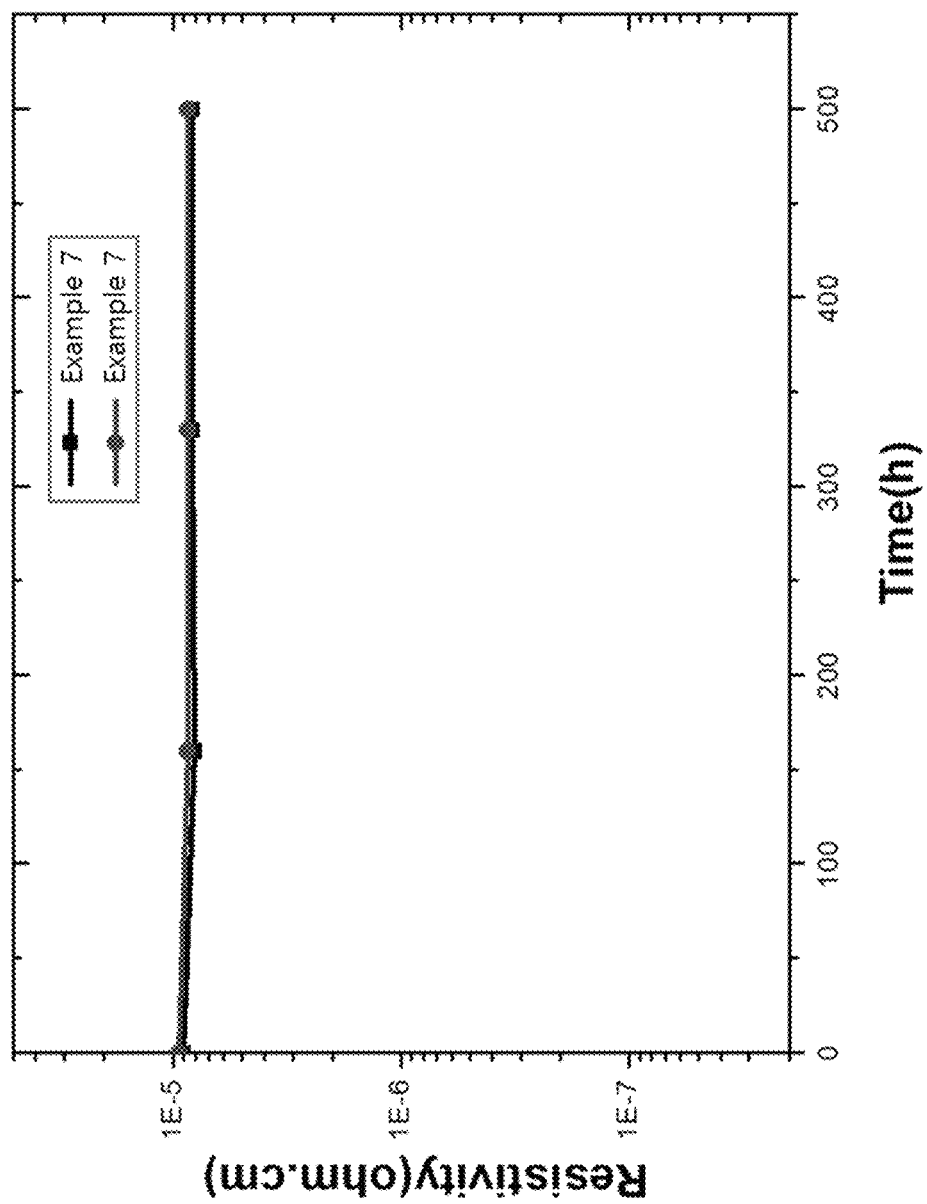
FIG. 14 is a graph obtained by indexing a variation of resistivity based on 1 when performing the severe test on the electrode formed by using the conductive paste composition according to Example 7 of the present disclosure.

As shown in Tables 13 to 15, it could be confirmed that the electrode formed using the conductive paste composition according to the present disclosure had reduced resistivity under a severe condition, thereby having very excellent weather resistance (see FIGS. 12 to 14). On the other hand, it could be confirmed that in Comparative Examples 2 to 6, it was impossible to measure the resistivity since they were over loaded, and in Comparative Example 7, the resistivity change amount was very high and the weather resistance was very poor. Further, in Comparative Example 16, it could be confirmed that the resistivity was increased under severe conditions, and thus, the weather resistance was excessively poor.

From the above results, the present inventors found that when the conductive paste composition was prepared according to the present disclosure, and the electrode was formed by using the conductive paste composition according to the present disclosure, it was possible to improve productivity according to the cost reduction by replacing expensive silver with the copper-based particle as the conductive metal, and to exhibit low resistivity at the same level or higher while simultaneously minimizing natural oxidation even when the electrode is exposed to the air after being formed, thereby improving weather resistance.

When the electrode is formed by using the conductive paste composition according to the present disclosure, it is possible to improve productivity according to the cost reduction by replacing expensive silver with the copper-based particle as the conductive metal, and to exhibit low resistivity at the same level or higher while simultaneously minimizing natural oxidation even when the electrode is exposed to the air after being formed, thereby improving weather resistance.

What is claimed is:

1. A conductive paste composition comprising:
a copper-based particle; and
a boron-based particle of which a surface is partially or entirely coated with boron oxide,
wherein the boron-based particle is a crystalline boron-based particle or an amorphous boron-based particle,
wherein the boron-based particle has a content of more than 1 wt % to less than 10 wt % based on a total content of the conductive paste composition, wherein an oxygen atom content of the boron-based particle is 2 wt % to 15 wt % based on the total content of the boron-based particle and
wherein the boron-based particle has a specific surface area of more than 11.03 m²/g to 25 m²/g or less.

2. The conductive paste composition of claim 1, wherein the copper-based particle is 1) a copper particle or 2) a copper-based particle of which a surface is partially or entirely coated with silver.

3. The conductive paste composition of claim 2, wherein a silver atom content of the copper-based particle is 1 wt % to 16 wt % based on a total content of the copper-based particle of which a surface is partially or entirely coated with silver.

4. The conductive paste composition of claim 1, wherein the boron-based particle has an average particle diameter of 2 μm or less.

5. A conductive paste composition comprising:
a copper-based particle; and
a boron-based particle of which a surface is partially or entirely coated with boron oxide,
wherein the boron-based particle is a crystalline boron-based particle or an amorphous boron-based particle,
wherein the boron-based particle has a content of more than 1 wt % to less than 10 wt % based on a total content of the conductive paste composition, and
wherein an oxygen atom content of the boron-based particle is 2 wt % to 15 wt % based on the total content of the boron-based particle.

6. The conductive paste composition of claim 1, wherein the conductive paste composition further comprises a binder.

* * * * *